(12) United States Patent
Min et al.

(10) Patent No.: US 11,658,264 B2
(45) Date of Patent: May 23, 2023

(54) LIGHT EMITTING DEVICE HAVING A SUBSTRATE WITH A PATTERN OF PROTRUSIONS AND MANUFACTURING METHOD THEREOF

(71) Applicant: SEOUL VIOSYS CO., LTD., Gyeonggi-do (KR)

(72) Inventors: Dae Hong Min, Gyeonggi-do (KR); Jun Ho Yoon, Gyeonggi-do (KR); Woo Cheol Gwak, Gyeonggi-do (KR); Jin Woo Huh, Gyeonggi-do (KR); Yong Hyun Baek, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 60 days.

(21) Appl. No.: 17/025,254

(22) Filed: Sep. 18, 2020

(65) Prior Publication Data

US 2021/0074883 A1 Mar. 11, 2021

Related U.S. Application Data

(63) Continuation of application No. PCT/KR2019/008410, filed on Jul. 9, 2019.

(30) Foreign Application Priority Data

Jul. 9, 2018 (KR) .................. 10-2018-0079626
Oct. 8, 2018 (KR) .................. 10-2018-0119585
Oct. 15, 2018 (KR) .................. 10-2018-0122759

(51) Int. Cl.
*H01L 33/10* (2010.01)

(52) U.S. Cl.
CPC .................. *H01L 33/10* (2013.01)

(58) Field of Classification Search
CPC ......... H01L 33/20; H01L 33/22; H01L 33/10; H01L 33/025; H01L 33/382; H01L 33/007; H01L 33/24
See application file for complete search history.

(56) References Cited

U.S. PATENT DOCUMENTS 6,657,236 B1 * 12/2003 Thibeault ............... H01L 33/20
257/97
2007/0217460 A1 * 9/2007 Ishibashi ........... H01L 21/02458
372/45.01

(Continued)

FOREIGN PATENT DOCUMENTS

JP 2010219269 A 9/2010
JP 5330040 B2 10/2013

(Continued)

OTHER PUBLICATIONS

Supplementary European Search Report issued in corresponding EP Application No. 19834046.5, dated Jan. 27, 2022, 19 pages.

(Continued)

*Primary Examiner* — Thanhha S Pham
(74) *Attorney, Agent, or Firm* — LaBatt, LLC

(57) ABSTRACT

A light emitting device includes a substrate; a pattern of a plurality of protrusions protruding from the substrate; a first semiconductor layer provided on the substrate; an active layer provided on the first semiconductor layer; and a second semiconductor layer provided on the active layer, in which each of the protrusions includes a first layer formed integrally with the substrate and protruding from an upper surface of the base substrate; and a second layer provided on the first layer and formed of a material different from that of the first layer.

19 Claims, 29 Drawing Sheets

(56) References Cited

U.S. PATENT DOCUMENTS

| | | | | |
|---|---|---|---|---|
| 2011/0127554 A1* | 6/2011 | Lee | ...................... | H01L 33/387 |
| | | | | 257/E33.072 |
| 2015/0076505 A1* | 3/2015 | Ke | ...................... | H01L 33/005 |
| | | | | 438/29 |
| 2015/0340558 A1 | 11/2015 | Lee | | |
| 2016/0372643 A1 | 12/2016 | Kim et al. | | |
| 2018/0047871 A1 | 2/2018 | Jung et al. | | |
| 2019/0334059 A1* | 10/2019 | Chen | ...................... | H01L 33/20 |

FOREIGN PATENT DOCUMENTS

| | | |
|---|---|---|
| KR | 10-0993093 | 11/2010 |
| KR | 20110061910 A | 6/2011 |
| KR | 10-2011-0093007 | 8/2011 |
| KR | 10-2012-0128961 | 11/2012 |
| KR | 10-1338698 | 12/2013 |
| KR | 20170000045 A | 1/2017 |
| WO | 2011058890 A | 5/2011 |

OTHER PUBLICATIONS

International Search Report for International Application PCT/KR2019/008410, dated Oct. 16, 2019.

English translation of office action for Korean Application No. 10-2018-0079626, dated Nov. 18, 2022, 5 pages.

Office action for Korean Application No. 10-2018-0079626, dated Mar. 15, 2023 with English translation, 10 pages.

Office action for Korean Application No. 10-2018-0122759, dated Mar. 17, 2023 with English translation, 9 pages.

\* cited by examiner

COMPARATIVE EXAMPLE 1

COMPARATIVE EXAMPLE 2

COMPARATIVE EXAMPLE 3

COMPARATIVE EXAMPLE 4

INVENTIVE EXAMPLE 1

INVENTIVE EXAMPLE 2

INVENTIVE EXAMPLE 3

INVENTIVE EXAMPLE 4

X-Axis Key:
1: Comparative Example 1 (FIG. 15A)
2: Inventive Example 1 (FIG. 16A)
3: Comparative Example 2 (FIG. 15B)
4: Inventive Example 2 (FIG. 16B)
5: Comparative Example 3 (FIG. 15C)
6: Inventive Example 3 (FIG. 16C)
7: Comparative Example 4 (FIG. 15D)
8: Inventive Example 4 (FIG. 16D)

RELATED ART

LIGHT EMITTING DEVICE HAVING A SUBSTRATE WITH A PATTERN OF PROTRUSIONS AND MANUFACTURING METHOD THEREOF

CROSS-REFERENCE TO RELATED APPLICATIONS AND PRIORITY

This application is a continuation of PCT/KR2019/008410, filed on Jul. 9, 2019, which claims priority to and the benefit of Korean Patent Application Nos. 10-2018-0079626 filed on Jul. 9, 2018, 10-2020-0119585 filed on Oct. 8, 2018, and 10-2018-0122759 filed on Oct. 15, 2018, the disclosures of which are incorporated herein in their entireties by reference.

TECHNICAL FIELD

Exemplary embodiments relate to a light emitting device and a manufacturing method thereof.

BACKGROUND

Light emitting diodes (LED) has been recently used as one of self-emission light sources. Light emitting diodes use characteristics of compound semiconductors to convert electrical signals into forms of light such as infrared, visible, and ultraviolet light. As luminous efficiency of a light emitting device has increased, the light emitting device has been applied to various fields including a display apparatus and general lighting.

SUMMARY

Exemplary embodiments provide a light emitting device having high light extraction efficiency and reliability and a method of manufacturing the same.

Alight emitting device according to an exemplary embodiment includes a substrate; a pattern of a plurality of protrusions protruding from the substrate; a first semiconductor layer provided on the substrate; an active layer provided on the first semiconductor layer; and a second semiconductor layer provided on the active layer, in which each of the protrusions includes a first layer formed integrally with and inseparably from the substrate and protruding from an upper surface of the base substrate; and a second layer provided on the first layer and formed of a material different from that of the first layer, when a distance between centers of two adjacent protrusions is called a pitch, a ratio of a diameter of the protrusion to the pitch is about 0.8 to about 1.0.

According to an exemplary embodiment, the diameter of each of the protrusions may be about 2.5 μm to about 3.5 μm, and the pitch may be about 2.5 μm or more and about 3.5 μm or less.

According to an exemplary embodiment, the diameter of each of the protrusions may be about 2.6 μm to about 2.8 μm, and the pitch may be about 2.9 μm to about 3.1 μm.

According to an exemplary embodiment, the diameter of each of the protrusions may be about 2.8 μm.

According to an exemplary embodiment, a ratio of a height of the first layer to that of the second layer may be about 0.2 to about 1.5, and may be about 0.75 to about 1.5. Alternatively, the height of the second layer may be greater than that of the first layer.

According to an exemplary embodiment, the diameter of the protrusion may be equal to or smaller than the pitch.

According to an exemplary embodiment, an inclination degree of aside surface of the first layer and that of a side surface of the second layer may be different.

According to an exemplary embodiment, the first semiconductor layer may be provided with voids in a portion of a region corresponding to a side of the protrusion.

A light emitting device according to an exemplary embodiment may include a substrate; a pattern of a plurality of protrusions including a first layer formed integrally with and inseparably from the substrate and protruding from an upper surface of the substrate, and a second layer provided on the first layer and formed of a material different from that of the first layer; and a light emitting stack provided on the substrate and emitting light, in which the light emitting stack may have voids provided on at least one side of the first layer of the protrusion, and a ratio of a height of the first layer to that of the second layer may be greater than 2.5 and less than 9.5.

According to an exemplary embodiment, the light emitting stack may include a first semiconductor layer provided on the substrate; an active layer provided on the first semiconductor layer; and a second semiconductor layer provided on the active layer, in which the voids may be provided in the first semiconductor layer.

According to an exemplary embodiment, a height of an uppermost portion of the voids from the substrate surface and that of an uppermost portion of the first layer from the substrate surface may be substantially the same.

According to an exemplary embodiment, the voids, when the upper surface of the first layer has a circular shape when viewed on a plane, may be provided corresponding to vertexes of a regular hexagon inscribed to the circle.

According to an exemplary embodiment, when cut along a plane perpendicular to the upper surface of the substrate and passing through a center of the circle, the voids may have a right triangle shape, and a hypotenuse of the right triangle may be a side surface of the first layer.

According to an exemplary embodiment, a ratio of a height of the first layer to that of the second layer may be greater than 2.5 and less than 9.5.

According to an exemplary embodiment, the height of the first layer may be about 0.25 or more and about 0.55 or less, and the sum of the heights of the first layer and the second layer may be about 2.1 μm.

A method of manufacturing the light emitting device according to an exemplary embodiment described above may include steps of forming a pattern of a plurality of protrusions on a substrate, each of the protrusions including a first layer protruding from an upper surface of the substrate, and a second layer provided on the first layer and formed of a material different from that of the first layer; and sequentially forming a first semiconductor layer, an active layer, and a second semiconductor layer on the substrate, in which the step of forming of the first semiconductor layer may include three dimensionally (3D) growing a material of the first semiconductor layer on the substrate, and two dimensionally (2D) growing the material of the first semiconductor layer on the substrate.

A light emitting device according to an exemplary embodiment may include a substrate; a pattern of a plurality of protrusions each including a first layer formed integrally with and inseparably from the substrate and protruding from a surface of the substrate, and a second layer provided on the first layer and formed of a material different from that of the first layer; and a light emitting stack provided on the substrate and emitting light, in which the first layer may include an upper surface and a side surface connecting the substrate surface and the upper surface of the first layer; and the upper surface of the first layer may have a roughened surface.

According to an exemplary embodiment, in the roughened surface of the upper surface of the first layer, a standard deviation Rq of the roughness may be about 0.300 nm to about 0.550 nm, and an arithmetic mean Ra of the roughness may be about 0.250 nm to about 0.400 nm.

According to an exemplary embodiment, the light emitting stack may include a first semiconductor layer provided on the substrate and covering the pattern of the protrusions; an active layer provided on the first semiconductor layer; and a second semiconductor layer provided on the active layer, in which light emitted from the active layer may proceed in a direction of the substrate through the first semiconductor layer.

According to an exemplary embodiment, a refractive index of the first layer may be greater than that of the second layer.

According to an exemplary embodiment, the refractive index of the first layer may be about 1.6 to about 2.45, and that of the second layer may be about 1.3 to about 2.0.

According to an exemplary embodiment, the refractive indices of the first layer and the second layer may be smaller than that of the first semiconductor layer. According to an exemplary embodiment, the refractive index of the first semiconductor layer may be about 2.0 to about 2.5.

According to an exemplary embodiment, the substrate may have a roughened surface in a region where the protrusions are not provided.

According to an exemplary embodiment, the side surface may be a reflection surface that reflects 90% or more of light proceeding in a direction of the side surface from the first semiconductor layer.

According to an exemplary embodiment, a method of manufacturing a light emitting device having the above-described structure may include steps of preparing a substrate; forming a roughened surface on an upper surface of the substrate; forming an insulation layer of a material having a different refractive index from that of the substrate; forming a photoresist on the insulation layer and patterning the photoresist using photolithography; reflowing the photoresist; etching the insulation layer and the substrate using the photoresist as a mask, and forming a light emitting stack on the substrate.

According to an exemplary embodiment, the roughened surface may be formed by at least any one of wet etching, dry etching, and grinding.

According to an exemplary embodiment, the step of etching the insulation layer and the substrate may be performed anisotropically.

Exemplary embodiments provide a light emitting device having high light extraction efficiency and reliability and a method of manufacturing the same.

DETAILED DESCRIPTION

Figure 1:
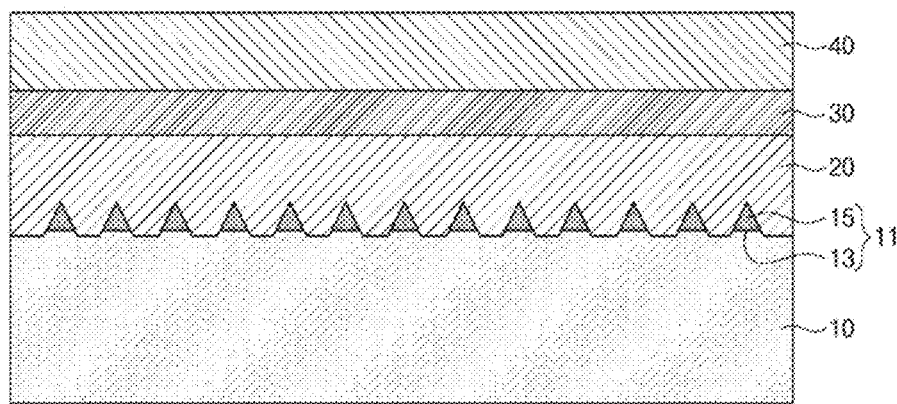
FIG. 1 is a schematic cross-sectional view illustrating a light emitting device according to an exemplary embodiment.

The inventive concepts can be applied to various modifications and can have various forms, and specific exemplary embodiments are illustrated in the drawings and described in detail in the following description. However, the inventive concepts are not intended to limit the present inventive concepts to specific forms in the disclosure, and are to be understood as including all modifications, equivalents, and substitutes included in the spirit and technical scope of the present disclosure.

Hereinafter, desirable exemplary embodiments of the present disclosure will be described in detail with reference to the accompanying drawings.

FIG. 1 is a schematic cross-sectional view illustrating a light emitting device according to an exemplary embodiment.

Referring to FIG. 1, the light emitting device according to an exemplary embodiment includes a substrate 10 and a light emitting stack provided on the substrate 10.

The light emitting stack includes a first semiconductor layer 20, an active layer 30, and a second semiconductor layer 40 which are sequentially provided on the substrate 10.

The substrate 10 may be a transmissive or non-transmissive substrate, and may be a conductive or insulating substrate. The substrate 10 may be a growth substrate for growing a semiconductor single crystal, for example, a nitride single crystal.

A sapphire substrate may be used as the substrate 10. However, the inventive concepts are not limited thereto, and the substrate 10 may be formed of various materials, such as SiC, Si, GaAs, GaN, ZnO, GaP, InP, Ge, $Ga_2O_3$, or the like. In particular, sapphire may have a crystalline structure having hexagonal Rombo-type (Hexa-Rhombo R3c) symmetry. In a case of sapphire, lattice constants in the c-axis and a-axis directions are 13.001 Å and 4.758 Å, and sapphire has a c (0001) plane, an a (1120) plane, and an r (1102) plane. Since c-plane of sapphire is relatively easy to grow a nitride thin film and is stable at a high temperature, it may be used as a substrate for growing a nitride semiconductor.

In an exemplary embodiment of the present disclosure, the substrate 10 is patterned, and a pattern of a plurality of protrusions 11 is provided on an upper surface thereof. In other words, the protrusions 11 are provided in a form protruding in an upper direction from the upper surface of the substrate 10 as shown in FIG. 1. In an exemplary embodiment, the protrusions 11 may be provided in an inverted conical shape in which a width thereof decreases toward the upper direction, so that, when cutting the protrusions 11 with a plane perpendicular to the substrate 10, the cross-section of the protrusion 11 may be approximately triangular, as shown in FIG. 1.

The protrusion 11 includes a first layer 13 and a second layer 15 which are sequentially stacked from the upper surface of the substrate 10. The first layer 13 is provided on the substrate 10, and the second layer 15 is provided on the first layer 13.

Figure 2:
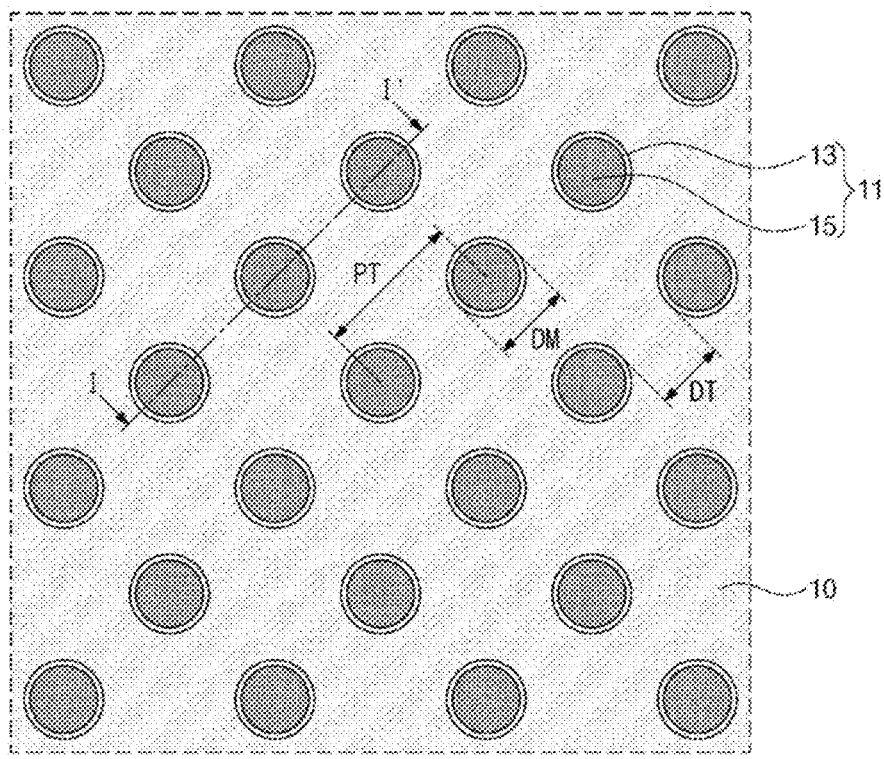
FIG. 2 is a plan view of a substrate with a pattern of protrusions provided thereon among elements of the light emitting device of FIG. 1.

The first layer 13 is formed integrally with and inseparably from the substrate 10. As such, the first layer 13 includes the same material as that of the substrate 10. An upper surface of the first layer 13 may have a circular shape when a shape of the protrusion 11 is a cone, as shown in FIG. 2.

The second layer 15 is formed of a different material from that of the first layer 13. The material of the second layer 15 may be a material having a different refractive index from that of the material of the first layer 13, and in an exemplary embodiment of the present disclosure, the refractive index of the first layer 13 may be greater than that of the second layer 15. In this case, various insulating materials having a lower refractive index than that of the first layer 13 may be used as the material of the second layer 15, for example, an insulating material having a refractive index of about 1.0 to about 1.7. The second layer 15 may include as the material having the refractive index, for example, $SiO_x$, $SiO_xN_y$, $SiN_x$. In an exemplary embodiment, the first layer 13 may include sapphire, and the second layer 15 may include $SiO_2$. In this case, the refractive index of the first layer 13 may be about 1.76 and that of the second layer 15 may be about 1.46, which may be smaller than that of the substrate 10.

A plurality of compound semiconductor layers may be provided on the substrate 10 provided with the protrusions 11 thereon. The plurality of compound semiconductor layers may be formed by various methods, for example, electron beam deposition, physical vapor deposition (PVD), chemical vapor deposition (CVD), plasma laser deposition (PLD), dual-type thermal evaporation, sputtering, metal organic chemical vapor deposition (MOCVD), or the like. However, the inventive concepts are not limited thereto.

The first semiconductor layer 20 may be provided on the substrate 10. The first semiconductor layer 20 is a semiconductor layer doped with a first conductivity type dopant. The first conductivity type dopant may be an n-type dopant. The first conductivity type dopant may be Si, Ge, Se, Te or C.

In an exemplary embodiment of the present disclosure, the first semiconductor layer 20 may include a nitride-based semiconductor material. For example, the first semiconductor layer 20 may include a semiconductor material having a composition formula of $In_xAl_yGa_{1-x-y}N$ ($0 \leq x \leq 1$, $0 \leq y \leq 1$, $0 \leq x+y \leq 1$). In an exemplary embodiment, the semiconductor material having the composition formula may include GaN, AlN, AlGaN, InGaN, InN, InAlGaN, AlInN, AlGaAs, GaP, GaAs, GaAsP, AlGaInP, or the like. The first semiconductor layer 20 may be formed by using the semiconductor material to grow to include an n-type dopant such as Si, Ge, Sn, Se, Te, or the like.

In an exemplary embodiment of the present disclosure, the first semiconductor layer 20 may further have a structure formed by alternately stacking two types of layers having different band gaps. The structure formed by alternately stacking two types of layers having different band gaps may be a superlattice structure, and thus, the first semiconductor layer 20 may improve current spreading and relieve stress.

Two types of layers having different band gaps are alternately formed, but may include different thin film crystal layers. In this case, when two layers having different band gaps are alternately stacked, a periodic structure may be formed of a crystal lattice that is longer than the basic unit lattice. Two layers having different band gaps are a layer having a wide band gap and a layer having a narrow band gap. In an exemplary embodiment, the layer having a wide band gap may be $Al_aGa_bIn_{(1-a-b)}N$ ($0 \leq a < 1$, $0 < b \leq 1$), for example, a GaN layer. The layer having a narrow band gap may be $Al_aGa_bIn_{(1-a-b)}N$ ($0 \leq a < 1$, $0 < b \leq 1$), for example, $Ga_bIn_{(1-b)}N$ ($0 < b \leq 1$).

In an exemplary embodiment of the present disclosure, at least one of the wide band gap layer and the narrow band gap layer may include n-type impurities.

Referring back to FIG. 1, the active layer 30 is provided on the first semiconductor layer 20 and corresponds to a light emitting layer. The active layer 30 is a layer in which electrons (or holes) injected through a first conductive type semiconductor layer and holes (or electrons) injected through the second semiconductor layer 40 meet each other, and light is emitted by a difference in a band gap of an energy band according to a forming material of the active layer 30. The active layer 30 may emit at least one peak wavelength of ultraviolet, blue, green, and red.

The active layer 30 may be formed of a compound semiconductor. The active layer 30 may be implemented, for example, by at least one of compound semiconductors by the combination of Group 3 and Group 5 elements or Group 2 and Group 6 elements. A quantum well structure may be employed in the active layer 30, and the active layer 30 may have a multi-quantum well structure in which quantum well layers and barrier layers are alternately stacked. However, the inventive concepts are not limited thereto, the structure of the active layer 30 may be a quantum wire structure, a quantum dot structure, or the like.

In an exemplary embodiment of the present disclosure, the quantum well layer may be disposed of a material having a composition formula of $In_xAl_yGa_{1-x-y}N$ ($0 \leq x \leq 1$, $0 \leq y \leq 1$, $0 \leq x+y \leq 1$). The barrier layer may be formed of a semiconductor material having a composition formula of $In_xAl_yGa_{1-x-y}N$ ($0 \leq x \leq 1$, $0 \leq y \leq 1$, $0 \leq x+y \leq 1$), and may be provided in a different composition ratio from that of the well layer. Herein, the barrier layer may have a band gap wider than that of the well layer.

The well layer and the barrier layer may include at least one of pairs, for example, AlGaAs/GaAs, InGaAs/GaAs, InGaN/GaN, GaN/AlGaN, AlGaN/AlGaN, InGaN/AlGaN, InGaN/InGaN, InGaP/GaP, AlInGaP/InGaP, InP/GaAs. In an exemplary embodiment, the well layer of the active layer 30 may include InGaN, and the barrier layer may include AlGaN-based semiconductor. In an exemplary embodiment of the present disclosure, an indium composition of the well layer may have a higher composition ratio than that of the barrier layer, and the barrier layer may not have the indium composition. In addition, the well layer may not include aluminum, and the barrier layer may include aluminum. However, the compositions of the well layer and the barrier layer are not limited thereto.

According to an exemplary embodiment, the barrier layer may have a thickness greater than that of the well layer. However, when the thickness of the well layer is too thin, a confinement efficiency of a carrier may be lowered, and when the thickness thereof is too thick, the carrier may be excessively confined. When the thickness of the barrier layer is too thin, the blocking efficiency of electrons may be lowered, and when the thickness thereof is too thick, the electrons may be excessively blocked.

As such, the thicknesses of the barrier layer and the well layer may be appropriately adjusted, and thus, each carrier may be effectively confined to the well layer according to the wavelength of light and the structure of the quantum well.

In an exemplary embodiment of the present disclosure, the thickness of each well layer is not particularly limited, and each thickness may be substantially the same or different. When the thickness of each well layer is substantially the same, since the quantum level is substantially the same, the emission wavelength in each well layer may be substantially the same. In this case, an emission spectrum with a narrow half width may be obtained. When the thickness of each well layer is different, the emission wavelength of each well layer may be changed, and accordingly, the width of the emission spectrum may be widened.

In an exemplary embodiment of the present disclosure, at least one of the plurality of barrier layers may include a dopant, and, for example, may include at least one of an n-type and a p-type dopant. When an n-type dopant is added, the barrier layer may be an n-type semiconductor layer. When the barrier layer is the n-type semiconductor layer, injection efficiency of electrons injected into the active layer 30 may be increased.

In an exemplary embodiment of the present disclosure, the barrier layer may have various thicknesses, but an uppermost barrier layer may have substantially the same thickness or a larger thickness than those of other barrier layers.

When the active layer 30 has a multi-quantum well structure, compositions of the quantum well layer and the barrier layer may be set in accordance with the emission wavelength required for the light emitting device. In an exemplary embodiment, all of the compositions of the plurality of well layers may be substantially the same, or may not be the same. For example, the well layer on the lower side may contain impurities, but the well layer on the upper side may not contain impurities.

As shown in FIG. 1, the second semiconductor layer 40 is provided on the active layer 30. The second semiconductor layer 40 has a second conductivity type dopant having a polarity opposite to that of the first conductivity type dopant. The second conductivity type dopant may be a p-type dopant, and the second conductivity type dopant may include, for example, Mg, Zn, Ca, Sr, Ba, or the like.

In an exemplary embodiment of the present disclosure, the second semiconductor layer 40 may include a nitride-based semiconductor material. The second semiconductor layer 40 may be formed of a semiconductor material having a composition formula of $In_xAl_yGa_{1-x-y}N$ ($0 \leq x \leq 1$, $0 \leq y \leq 1$, $0 \leq x+y \leq 1$). In an exemplary embodiment, the semiconductor material having the composition formula may include GaN, AlN, AlGaN, InGaN, InN, InAlGaN, AlInN, AlGaAs, GaP, GaAs, GaAsP, AlGaInP, or the like. The second semiconductor layer 40 may be formed by using the semiconductor material to grow to include a p-type dopant such as Mg, Zn, Ca, Sr, Ba, or the like.

Although not shown, in addition to the substrate 10, the first semiconductor layer 20, the active layer 30, and the second semiconductor layer 40, a functional layer such as a buffer layer and/or an electron blocking layer may be further provided.

For example, the buffer layer may be provided on the substrate 10 and on the first semiconductor layer 20. The buffer layer may be formed of a single layer or multiple layers. In an exemplary embodiment, the buffer layer may be formed of $In_xAl_yGa_{1-x-y}N$ ($0 \leq x \leq 1$, $0 \leq y \leq 1$, $0 \leq x+y \leq 1$), and, for example, may include at least one of materials such as GaN, AlN, AlGaN, InGaN, InN, InAlGaN, AlInN, AlGaAs, GaP, GaAs, GaAsP, AlGaInP, and ZnO.

The buffer layer may be formed to have a super lattice structure by alternately arranging different semiconductor layers. The buffer layer may be disposed to alleviate the difference of lattice constants between the substrate 10 and the nitride-based semiconductor layer, and may be defined as a defect control layer. The lattice constant of the buffer layer may have a value between the lattice constants of the substrate 10 and the nitride-based semiconductor layer. The buffer layer may be omitted, but the inventive concepts are not limited thereto.

In addition, the electron blocking layer may be further disposed between the second semiconductor layer 40 and the active layer 30. The electron blocking layer may reduce the deterioration of crystallinity by the dopant in the second semiconductor layer 40 and prevent diffusion of the dopant in the second semiconductor layer 40 into the active layer 30. In addition, the electron blocking layer may block electrons from the active layer 30 from proceeding to the second semiconductor layer 40, thereby preventing the spread of current between the electron blocking layer and the second semiconductor layer 40. In an exemplary embodiment, the electron blocking layer may be formed of a semiconductor material having a composition formula of $In_xAl_yGa_{1-x-y}N$ ($0 \leq x \leq 1$, $0 \leq y \leq 1$, $0 \leq x+y \leq 1$). The electron blocking layer, for example, may be formed of at least one of GaN, AlGaN, InGaN, InAlGaN, and AlInN.

The electron blocking layer may have a wider band gap than that of the barrier layer in the active layer 30. The band gap of the electron blocking layer may vary depending on the composition of the material including the electron blocking layer. For example, when the electron blocking layer includes AlGaN, the band gap may be set differently by changing the composition ratio of aluminum, and, as the band gap widens, the electron blocking effect may be improved.

In an exemplary embodiment of the present disclosure, the electron blocking layer may be disposed in a single layer or multiple layers, and may include a second conductivity type dopant, for example, a p type conductivity type dopant. As such, the electron blocking layer may be, for example, a p-type semiconductor layer having a p-type dopant such as Mg, Zn, Ca, Sr, Ba, or the like, and the electron blocking layer may be at least one of GaN, AlGaN, InGaN including a p-type dopant. In an exemplary embodiment, the electron blocking layer may be formed of a superlattice structure in which at least two different layers are alternately arranged.

In the exemplary embodiment, the buffer layer and the electron blocking layer are disclosed as examples, and at least one of the buffer layer and the electron blocking layer may be omitted. Further, it is needless to say that an additional functional layer other than the buffer layer and the electron blocking layer may be further added to the light emitting device.

As described above, in the light emitting device according to the exemplary embodiment of the present disclosure, the pattern of the plurality of protrusions 11 is provided on the substrate 10, and the protrusions 11 will be described in detail.

Figure 3:
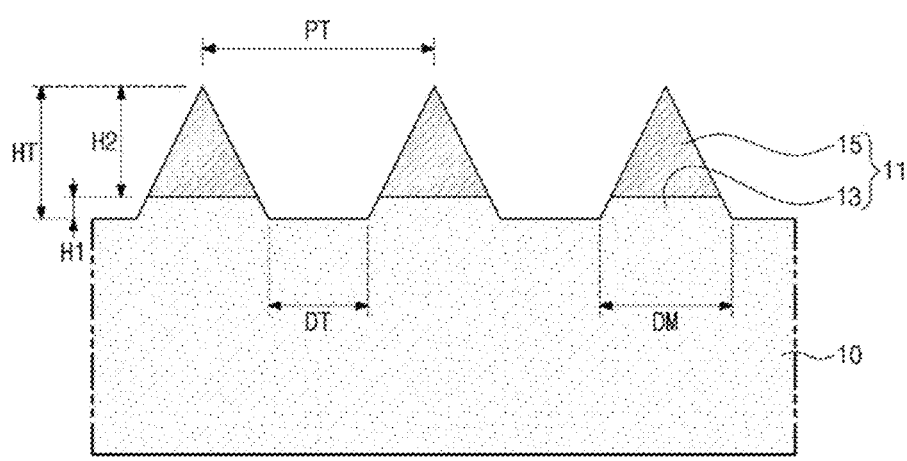
FIG. 3 is a cross-sectional view taken along line I-I' of FIG. 2.

FIG. 2 is a plan view of the substrate 10 with the protrusions 11 provided thereon among elements of the light emitting device of FIG. 1, and FIG. 3 is a cross-sectional view taken along line I-I' of FIG. 2.

Referring to FIG. 2 and FIG. 3, The protrusions 11 are provided on the upper surface of the substrate 10, and each of the protrusions 11 includes the first layer 13 and the second layer 15.

Each of the protrusions 11 may have a circular shape when viewed on a plane. When the protrusion 11 is provided in the conical shape, a vertex portion of the cone becomes a center.

The protrusion 11 may be provided in a size having a predetermined diameter DM and a height HT. The diameter DM is referred to a width of a lowermost end of the protrusion 11 when viewed on a cross-section, and the height HT is referred to a distance from the upper surface of the substrate 10 to the vertex of the protrusion 11, as illustrated in FIG. 3. In the exemplary embodiment, each of the protrusions 11 may have the same diameter DM and the same height HT from each other. However, each of the protrusions 11 may not have the exact same diameter DM and the exact same height HT, and the diameter DM and the height HT thereof may vary within a predetermined range.

The first layer 13 and the second layer 15 may have different diameters when viewed on a plan, but the first layer 13 and the second layer 15 may be provided in a concentric circle shape having the same center. When the protrusion 11 is provided in the conical shape, the diameter of the first layer 13 is larger than that of the second layer 15. Herein, the diameters of the first and second layers 13 and 15 are referred to the widths of lowermost ends of the first and second layers 13 and 15 when viewed on a cross-section.

In an exemplary embodiment of the present disclosure, the protrusion 11 may be arranged in various forms on the upper surface of the substrate 10. For example, the protrusion 11 may be arranged at each vertex of a square in a square lattice pattern, or may be arranged at each vertex of a hexagon in a hexagonal lattice pattern. In an exemplary embodiment of the present disclosure, it is exemplarily shown that the protrusion 11 is disposed at each vertex of the square in the square lattice pattern.

Each of the protrusions 11 may be arranged with predetermined pitch PT and distance DT from each other. The pitch PT is a distance between centers of two protrusions 11 adjacent to each other when viewed on a plane, and the distance DT is a distance between edges of two protrusions 11 adjacent to each other when viewed on a plane.

In an exemplary embodiment of the present disclosure, the diameter DM of the protrusion 11 may be equal to or smaller than the pitch PT. When the diameter DM of the protrusion 11 is larger than the pitch PT, the protrusions 11 overlap on a plane, and an area of the upper surface of the substrate 10 of the portion where the protrusions 11 are not provided decreases excessively. The upper surface of the substrate 10 that is not covered by the protrusions 11 is a location where growth of the first semiconductor layer 20 occurs thereafter. Accordingly, when the diameter DM of the protrusion 11 is larger than the pitch PT, growth of the first semiconductor layer 20 (see FIG. 1) does not occur sufficiently, which is disadvantageous in manufacturing a light emitting device.

According to an exemplary embodiment, the pitch PT and the distance DT may have different values depending on a direction of arrangement. In the exemplary embodiment, both the pitch PT and/or the distance DT are illustrated as the same in FIG. 3, but it is for convenience of description. The pitch PT and the distance DT need not be all the same, and the pitch PT and/or the distance DT may have a little difference within a predetermined range.

In an exemplary embodiment of the present disclosure, the pitch PT of the pattern of the protrusions 11 has a value within a predetermined range according to the diameter DM, and a ratio of the diameter DM of the protrusion 11 to the pitch PT may be in a range of about 0.8 to about 1.0. For example, when the diameter DM of the protrusion 11 is 2.5 µm to 3.5 µm, the pitch PT may be 2.5 µm or more and less than 3.5 µm. Alternatively, when the diameter DM of the protrusion 11 is 2.6 µm to 2.8 µm, the pitch PT may be 2.9 µm to 3.1 µm.

In an exemplary embodiment of the present disclosure, in the protrusions 11, the first layer 13 and the second layer 15 may be formed at various height ratios. Herein, a height H1 of the first layer 13 is formed to have a value greater than or equal to a predetermined value. When the height H1 of the first layer 13 is 0, growth of the first semiconductor layer 20 from the substrate 10 may be impeded by impurities remaining on the upper surface of the substrate 10 during a process. In an exemplary embodiment, a ratio of the height H1 of the first layer 13 to a height H2 of the second layer 15 may be 0.2 to 1.5. In another exemplary embodiment, the ratio of the height H1 of the first layer 13 to the height H2 of the second layer 15 may be 0.75 to 1.5, or the ratio of the height H1 of the first layer 13 to the height H2 of the second layer 15 may exceed 1. In an exemplary embodiment, the ratio of the height H1 of the first layer 13 to the height H2 of the second layer 15 is 0.75, the height of the first layer 13 may be 0.9 µm, the height of the second layer 15 may be 1.2 µm, and the diameter DM of the protrusion 11 may be about 2.7 to about 2.9 µm, for example, 2.8 µm.

In an exemplary embodiment of the present disclosure, when the height H2 of the second layer 15 is formed to have a value greater than the height H1 of the first layer 13, the crystal growth of the crystal in a direction of the side surface of the first layer 13 may decrease, thereby improving the quality of crystal.

In an exemplary embodiment of the present disclosure, inclination degrees of side surfaces of the first layer 13 and the second layer 15 may be at least partially the same or different from each other. In the drawing, although the inclination degrees of the first layer 13 and the second layer 15 have the same value, the inventive concepts are not limited thereto, and the inclination degrees of the side surfaces of the first layer 13 and the second layer 15 may be at least partially the same or different from each other. In particular, the inclination degrees at a portion where the first layer 13 and the second layer 15 contact each other may be different from each other. Since the materials of the first layer 13 and the second layer 15 are different from each other, the inclination degrees of the side surfaces thereof may be set differently according to process conditions during an etching process. In the exemplary embodiment, the inclination degrees of the first layer 13 and the second layer 15 are formed differently, and thus, a scattering degree of light emitted from the light emitting device may be increased, thereby improving light emission efficiency.

In an exemplary embodiment of the present disclosure, an arrangement of the protrusions 11 may be at regular intervals as illustrated, but the inventive concepts are not limited thereto. For example, the protrusions 11 may be arranged irregularly. Even in this case, when viewed entirely on the substrate 10, the pitch PT and the distance DT of the protrusions 11 per single area are within a predetermined range, and, in this case, a density thereof may be provided at substantially the same level.

In an exemplary embodiment of the present disclosure, for convenience of description, only the protrusion 11 is shown to have a conical shape, but the protrusion 11 may be modified in various shapes within the limits without departing from the concepts of the present disclosure. For example, the shape of the protrusion 11 may have a polygonal pyramid shape. In addition, even when provided in the conical shape, a shape of the curved surface forming the side surface may be partially modified.

The light emitting device having the above-described structure will be described with reference to FIGS. 1 through 3 as follows.

First, the substrate 10 is prepared, and an insulation layer is stacked using a material for forming the second layer 15 on the substrate 10. As described above, the substrate 10 may include a material, such as SiC, Si, GaAs, GaN, ZnO, GaP, InP, Ge, $Ga_2O_3$, or the like, and the insulation layer may include $SiO_x$, $SiO_xN_y$, $SiN_x$ or the like.

Next, after applying a photoresist on the insulation layer and forming a photoresist pattern through exposure and development, portions of the insulation layer and the substrate 10 are etched using the photoresist pattern as a mask. As such, the second layer 15 is formed by etching the insulation layer except for a portion where the protrusions 11 are to be formed. In a portion where the second layer 15 is not formed, the upper surface of the substrate 10 is exposed. Herein, the first layer 13 is formed by overetching the upper surface of the substrate 10 more than the upper surface of the original substrate 10 through additional etching. If only the second layer 15 is formed without forming the first layer 15 by performing etching such that the original upper surface of the substrate 10 is exposed, growth of the semiconductor layer may easily occur after the upper surface of the substrate 10 is exposed. However, growth of the first semiconductor layer 20 may not properly occur thereafter due to etching residues or impurities present on the upper surface of the substrate 10. As such, additional etching is performed to completely remove etching residues, impurities, or the like on the substrate 10 and the first layer 13 is formed.

Etching to form the first layer 13 and the second layer 15 may be performed under various conditions using various methods depending on materials. For example, portions of the insulation layer and the substrate 10 may be patterned using dry etching.

In the above-described method, the second layer 15 and the first layer 13 may be sequentially formed, and may be patterned using the same or different etching gases.

The first semiconductor layer 20 is formed on the substrate 10 on which the protrusions 11 are formed. The first semiconductor layer 20 is first grown in the upper direction from the exposed surface of the substrate 10, and then grown in the upper direction and the direction of the side surface.

Figure 4A:
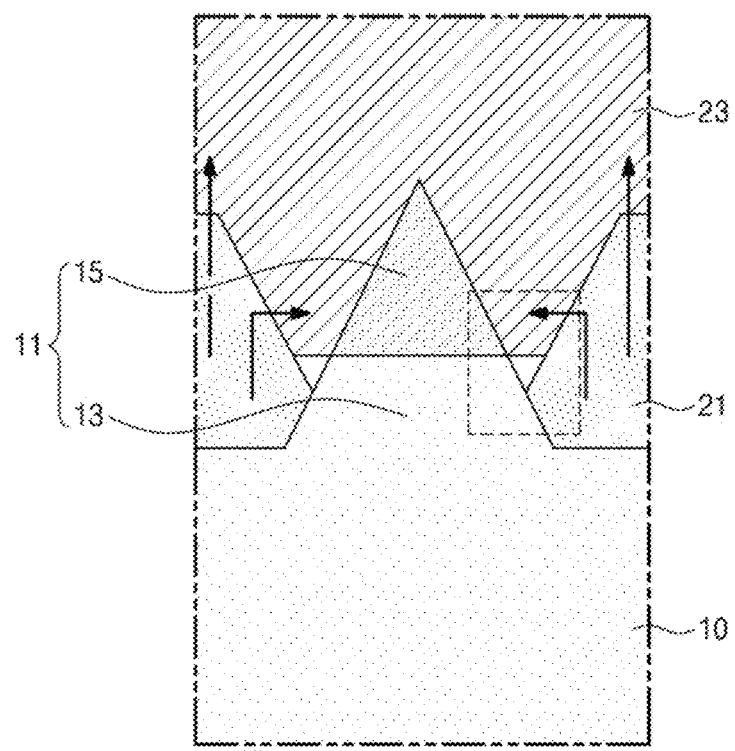
FIG. 4A shows a substrate on which a protrusion is provided and a direction of growing the substrate in a light emitting apparatus according to an exemplary embodiment.
Figure 4B:
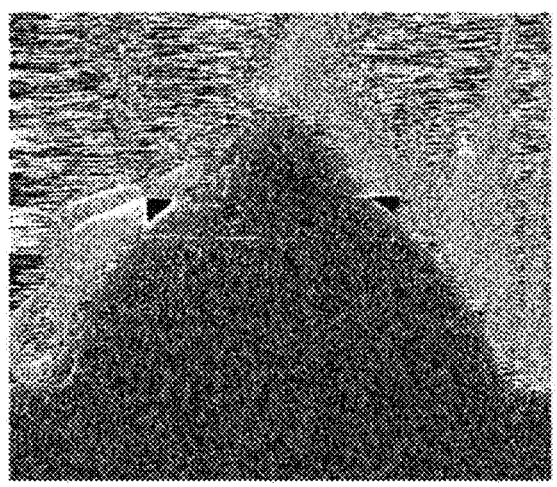
FIG. 4B is a photograph showing a first semiconductor layer which is actually grown on the substrate with the protrusion formed thereon.
Figure 5A:
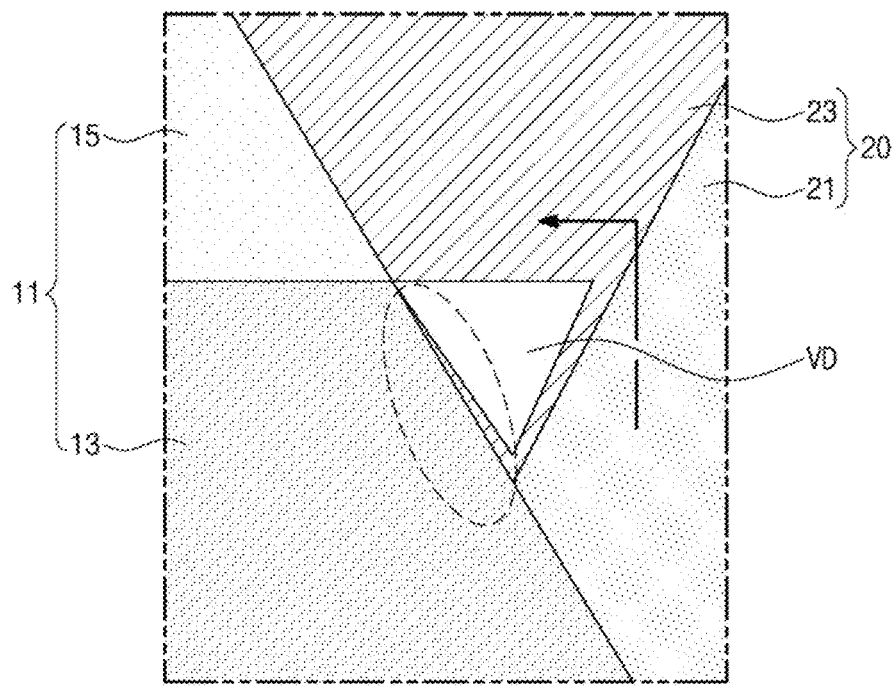
FIG. 5A is an enlarged view of a rectangular indicated in dotted lines in FIG. 4A.
Figure 5B:
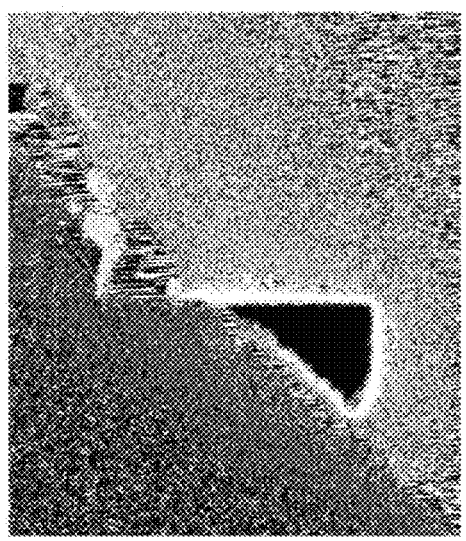
FIG. 5B is a photograph of a portion of FIG. 5A.

FIG. 4A shows a substrate 10 on which a protrusion 11 is provided and a direction of growing the substrate 10 in a light emitting apparatus according to an exemplary embodiment, and FIG. 4B is a photograph showing a first semiconductor layer 20 which is actually grown on the substrate with the protrusion formed thereon. FIG. 5A is an enlarged view of a rectangular area indicated in dotted lines in FIG. 4A, and FIG. 5B is a photograph of a portion of FIG. 5A. In FIG. 4A and FIG. 5A, a main direction of growing the semiconductor layer is indicated by arrows for convenience of description.

Referring to FIGS. 4A, 4B, 5A, and 5B, the first semiconductor layer 20 is formed in the upper direction. The first semiconductor layer 20 may be formed of a semiconductor layer of various materials, for example, an n-type nitride-based semiconductor layer, and may be formed using an organic metal vapor phase epitaxy or molecular beam epitaxy (MBE) or hydride vapor phase epitaxy (HVPE) method.

An initial growth of the first semiconductor layer 20 mainly occurs in the upper direction from an exposed surface of the substrate 10, and the growth does not occur on an upper surface of the second layer 15.

After the first semiconductor layer 20 is partially grown in the upper direction, the first semiconductor layer 20 is grown in the upper and side directions. In FIGS. 4A and 5A, for convenience of description, it is illustrated by dividing a first growth pattern 21 which is mainly grown in the upper direction and a second growth pattern 23 which is grown in the upper direction and in a direction of a side surface, but dominantly grown in the direction of the side surface.

In an exemplary embodiment of the present disclosure, for the growth in the direction of the side surface (horizontal direction in the drawing) of the first semiconductor layer 20, epitaxial lateral over-growth (ELOG) may be used as a metal-organic chemical vapor deposition (MOCVD) method. The first semiconductor layer 20 is merged to cover an entire surface of the substrate 10 including the surface of the second layer 15 by continuously growing in the direction of the side surface and the upper direction. As such, the first semiconductor layer 20 becomes a plate shape covering all surfaces of the substrate 10.

In an exemplary embodiment of the present disclosure, when forming the protrusions 11, a ratio of a diameter DM of the protrusion 11 to a pitch is formed to be within a range of about 0.8 to about 1.0, which is to reduce defects during growth of the first semiconductor layer 20.

In an exemplary embodiment of the present disclosure, the upper surface of the exposed substrate 10 between the protrusions 11 is a portion that becomes a substantial growth nucleus, and growth occurs in the upper direction from the upper surface of the substrate 10 like the first growth pattern 21, as shown in FIG. 4A. Thereafter, the first semiconductor layer 20 is grown along the side direction by the ELOG method like the second growth pattern 23. In growth of the first semiconductor layer 20, a surface of the first semiconductor layer 20 growing in the upper direction may be referred to as an upper surface and a surface of the first semiconductor layer 20 growing in the side direction may be referred to as a side surface. When the first semiconductor layer 20 is epitaxially grown by ELOG, growth of the side surface occurs more dominantly than growth of the upper surface due to conditions of ELOG, and the growth ratio of an m-axis and a c-axis is about 2:1. During the growth, the side surface of the first semiconductor layer 20 may be perpendicular to the upper surface of the first semiconductor layer 20, but the inventive concepts are not limited thereto, and it may be inclined to the upper surface of the first semiconductor layer 20. In an exemplary embodiment, the upper surface of the first semiconductor layer 20 may correspond to (0001) plane, and the side surface of the first semiconductor layer 20 may correspond to (10-11) plane.

As discussed in connection with FIGS. 2 and 3 above, the pitch between the protrusions 11 is provided within the above-described selected range (i.e., the diameter DM to the pitch PT=0.8 through 1.0), so that growth of the first semiconductor layer 20 is facilitated and light extraction efficiency in the final light emitting device increases.

The pitch between the protrusions 11 having the range smaller or larger than the selected range discussed here, may not be desirable, compared to the pitch within the selected range. Specifically, if the pitch is smaller than the above-mentioned range (DM/PT=0.8-1.0), growth of the crystals is slow because an interval between the protrusions 11 adjacent to each other is not sufficient. Further, even if growth occurs, the growth in the side direction occurs thereafter in a state that an area to be grown is small, and thus, a void VD on the side is formed. Herein, the void VD is formed corresponding to a direction of growing a crystal plane, and is formed on the side corresponding to each vertex of the hexagon based on the center of the protrusion 11. When the void VD is largely formed, crystals are also grown on the side of the protrusion 11 of the first layer 13 corresponding to a portion where the void VD is formed (a portion indicated by the dotted ellipse in FIG. 5A) in a direction that is different from an overall growth direction, which appears as a defect. The defect eventually leads to a decrease in the light extraction efficiency of the light emitting device.

On the other hand, if the pitch is larger than the above-mentioned selected range, the interval between the protrusions 11 adjacent to each other is sufficiently wide, so that growth of crystals is fast. Accordingly, a size of the void is small and the occurrence of defects on the side of the protrusion is reduced, but the distance between the protrusions 11 is reduced, and thus, the light scattering effect by the protrusions 11 is reduced, thereby reducing the light extraction efficiency.

After entirely forming the first semiconductor layer 20 through growing in the side direction, selectively, the first semiconductor layer 20 may be further grown in the upper direction using HVPE. When forming the first semiconductor layer 20 by using MOCVD, since a deposition rate thereof is slower than that of HVPE, HVPE may be used when the first semiconductor layer 20 is to be grown quickly to have a sufficient thickness.

In an exemplary embodiment of the present disclosure, a buffer layer may be further formed on the substrate 10 before forming the first semiconductor layer 20. In an exemplary embodiment, a superlattice structure may be formed by alternately stacking two types of layers having different band gaps on the first semiconductor layer 20. Referring back to FIG. 1, the active layer 30 is formed on the first semiconductor layer 20. In an exemplary embodiment, a quantum well structure may be formed by alternately stacking a quantum well layer and a barrier layer as the active layer 30. An electron blocking layer may be formed on the active layer 30, and then, a second semiconductor layer 40 may be formed on the active layer 30, and thus, a light emitting stack may be manufactured.

The light emitting device having the above structure has high light extraction efficiency and high reliability by reducing defects.

The light emitting device having the above-described structure may be implemented in various types of semiconductor chips.

Figure 6:
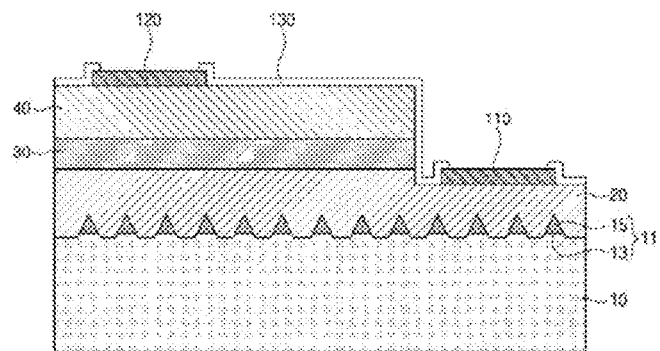
FIG. 6 is a cross-sectional view illustrating a semiconductor chip according to an exemplary embodiment, showing a lateral type semiconductor chip.

FIG. 6 is a cross-sectional view illustrating a semiconductor chip according to an exemplary embodiment, showing a lateral type semiconductor chip.

Referring to FIG. 6, the semiconductor chip includes a light emitting device and first and second electrodes 110 and 120 connected to the light emitting device. The light emitting device includes the substrate 10, the first semiconductor layer 20 provided on the substrate 10, the active layer 30, and the second semiconductor layer 40.

In the exemplary embodiment, the first electrode 110 is disposed on the first semiconductor layer 20 where the active layer 30 and the second semiconductor layer 40 are not provided, and the second electrode 120 is disposed on the second semiconductor layer 40.

The first and/or second electrodes 110 and 120 may include a single layer of metal or multi-layers of metal. Materials of the first and/or second electrodes 110 and 120 may include Al, Ti, Cr, Ni, Au, Ag, Cr, Cu, Ti, Ru, Rh, Ir, Mg, Zn, Al, In, Ta, Pd, Co, and various metals and alloys thereof.

Herein, the plurality of protrusions 11 is provided on an upper surface of the substrate 10 to increase light emission efficiency. The protrusion may be provided on the substrate 10 in a conical shape including the first layer 13 and the second layer 15, as described above.

An insulation film 130 is provided on the first and second electrodes 110 and 120, and contact holes exposing the first electrode 110 and the second electrode 120 are provided on the insulation film 130, as shown in FIG. 6. The insulation film 130 may be disposed on an upper surface of the second semiconductor layer 40 and side surfaces of the semiconductor layers, and may selectively contact the first and second electrodes 110 and 120. The insulation film 130 may include an insulating material or an insulating resin. For instance, the insulating material is formed of oxide, nitride, fluoride, or sulfide, each material including one of Al, Cr, Si, Ti, Zn, and Zr. The insulation film 130 may be selectively formed of, for example, $SiO_2$, $Si_3N_4$, $Al_2O_3$, $TiO_2$ or a combination thereof. The insulation film 130 may be formed of a single layer or multiple layers, but the inventive concepts are not limited thereto.

In an exemplary embodiment of the present disclosure, the first electrode 110 and the second electrode 120 may be connected to other elements through the contact holes. For example, the first and second electrodes 110 and 120 may be provided with first and second pads connected through the contact holes. In addition, in an exemplary embodiment of the present disclosure, the light emitting device is simply described with reference to the drawings, but the light emitting device may further include an element having an additional function in addition to the above-described layers. For example, various layers may be further included, such as a reflective layer that reflects light, an additional insulation layer to insulate specific elements, and an anti-solder layer that prevents diffusion of solder.

In addition, in forming a lateral type light emitting device, mesas may be formed in various forms, and a location and a shape of the first and second electrodes 110 and 120 may also be variously modified.

The light emitting device according to an exemplary embodiment of the present disclosure emits light by being turned on by applying a signal to the first electrode 110 and the second electrode 120, and emitted light may proceed in a lower direction of the first semiconductor layer 20, or may proceed in an upper direction of the second semiconductor layer 40.

Although the semiconductor chip including the light emitting device according to the above-described exemplary embodiment is illustrated as a lateral type, the inventive concepts are not limited thereto. For example, the light emitting device according to an exemplary embodiment may be applied to a vertical type semiconductor chip or a flip-chip type semiconductor chip.

Figure 7:
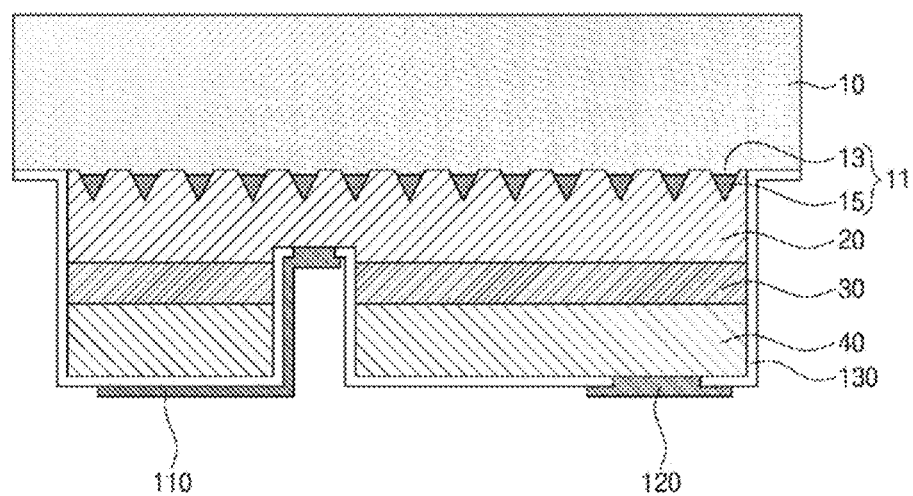
FIG. 7 is a cross-sectional view illustrating a semiconductor chip according to an exemplary embodiment, showing a flip-chip type semiconductor chip.

FIG. 7 is a cross-sectional view illustrating a semiconductor chip according to an exemplary embodiment, showing a flip-chip type semiconductor chip. Since the flip-chip type semiconductor is formed on the substrate 10 and then inverted and mounted on other elements, the flip-chip type semiconductor is shown in an inverted form in FIG. 7.

Referring to FIG. 7, the semiconductor chip includes a light emitting device and the first and second electrodes 110 and 120 connected to the light emitting device. The light emitting device includes the substrate 10, the first semiconductor layer 20 provided on the substrate 10, the active layer 30, and the second semiconductor layer 40.

In the exemplary embodiment, the light emitting device may include at least one mesa including the active layer 30 and the second semiconductor layer 40. The mesa may include a plurality of protrusions 11, and the plurality of protrusions 11 may be spaced apart from one another. An insulation film 130 is provided on the mesa, and the insulation film 130 has contact holes through which the first semiconductor layer 20 is exposed between the mesa and a portion of the second semiconductor layer 40. The first electrode 110 is connected to the first semiconductor layer 20 exposed through the contact hole between the mesas, and the second electrode 120 is connected to the second semiconductor layer 40 exposed through the contact hole formed on the second semiconductor layer 40, as illustrated in FIG. 7.

Hereinafter, light emission efficiency of the light emitting devices according to the above-described exemplary embodiment will be described.

Figure 8:
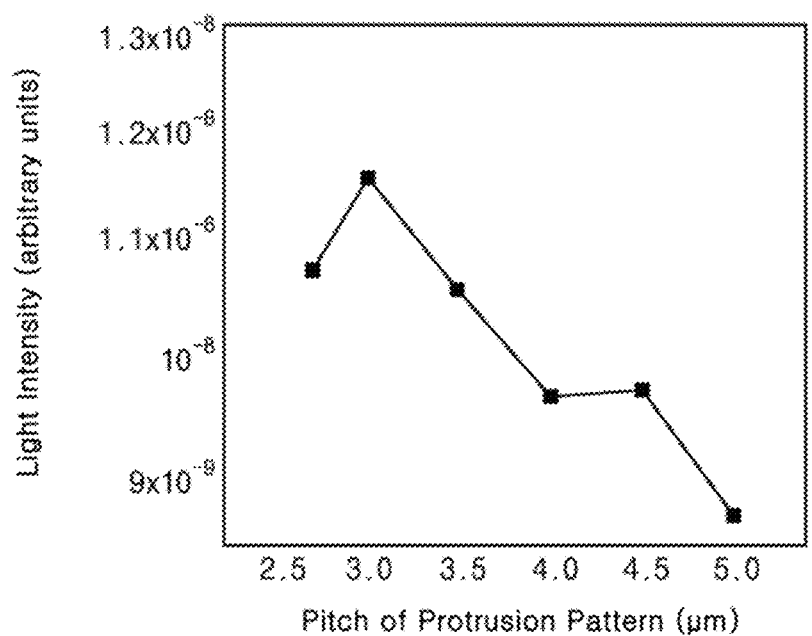
FIG. 8 is a graph showing light emission efficiency depending on pitches of a protrusion pattern in Table 1.

Table 1 is data showing light emission efficiency according to changes in pitches when the diameter and the height of the protrusion on the substrate are constant in the light emitting device. FIG. 8 is a graph showing light emission efficiency depending on the pitches of the protrusion pattern in Table 1.

In the following exemplary embodiment, the increase/decrease rate of the amount of light indicates the increase/decrease rate of the amount of light of the light emitting device of the prior art, with respect to the amount of light of the light emitting device according to the exemplary embodiment. The light emitting device of the prior art has only the first layer without the second layer. The protrusion pattern of the light emitting device according to the prior art had a pitch of 3 µm, a total height of 1.7 µm, and a diameter of 2.7 µm.

TABLE 1

| Pitch (μm) | Height (μm) | Height of 1st layer (μm) | Height of 2nd layer (μm) | Diameter (μm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 2.7 | 2.1 | 0.4 | 1.7 | 2.7 | $7.53 \times 10^{-09}$ | $3.11 \times 10^{-09}$ | $1.064 \times 10^{-08}$ | −4.45 |
| 3 | 2.1 | 0.4 | 1.7 | 2.7 | $8.08 \times 10^{-09}$ | $3.38 \times 10^{-09}$ | $1.1462 \times 10^{-08}$ | 2.94 |
| 3.5 | 2.1 | 0.4 | 1.7 | 2.7 | $7.42 \times 10^{-09}$ | $3.04 \times 10^{-09}$ | $1.046 \times 10^{-08}$ | −6.1 |
| 4 | 2.1 | 0.4 | 1.7 | 2.7 | $6.71 \times 10^{-09}$ | $2.88 \times 10^{-09}$ | $9.59 \times 10^{-09}$ | −13.9 |
| 4.5 | 2.1 | 0.4 | 1.7 | 2.7 | $6.78 \times 10^{-09}$ | $2.86 \times 10^{-09}$ | $9.64 \times 10^{-09}$ | −13.4 |
| 5 | 2.1 | 0.4 | 1.7 | 2.7 | $6.03 \times 10^{-09}$ | $2.66 \times 10^{-09}$ | $8.69 \times 10^{-09}$ | −22 |

Figure 9:
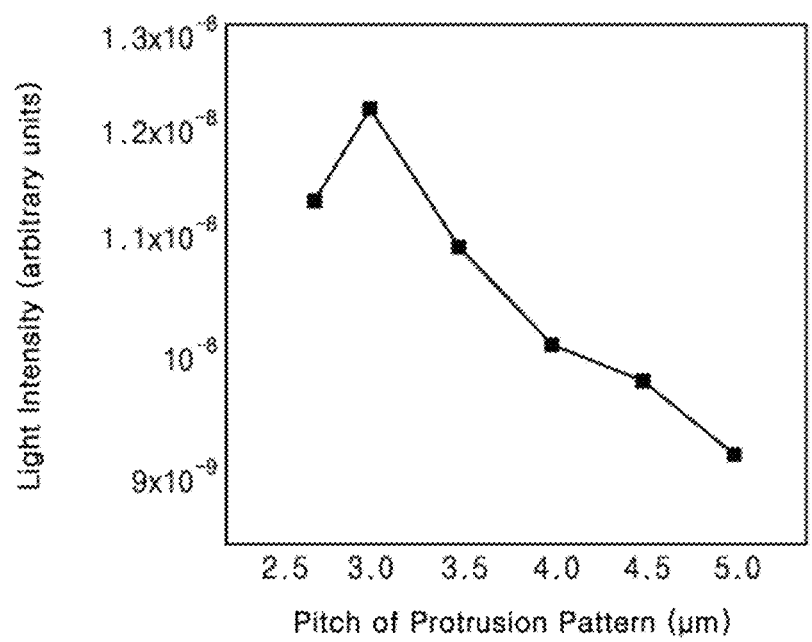
FIG. 9 is a graph showing light emission efficiency depending on pitches of a protrusion pattern in Table 2.

Table 2 is data showing light emission efficiency according to changes in pitches when the diameter and the height of the protrusion on the substrate are constant in the light emitting device. FIG. 9 is a graph showing light emission efficiency depending on the pitches of the protrusion pattern in Table 2.

TABLE 2

| Pitch (μm) | Height (μm) | Height of 1st layer (μm) | Height of 2nd layer (μm) | Diameter (μm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 2.7 | 2.1 | 0.9 | 1.2 | 2.7 | $7.69 \times 10^{-09}$ | $3.52 \times 10^{-09}$ | $1.1209 \times 10^{-08}$ | 0.7 |
| 3 | 2.1 | 0.9 | 1.2 | 2.7 | $8.49 \times 10^{-09}$ | $3.38 \times 10^{-09}$ | $1.1872 \times 10^{-08}$ | 6.6 |
| 3.5 | 2.1 | 0.9 | 1.2 | 2.7 | $7.39 \times 10^{-09}$ | $3.29 \times 10^{-09}$ | $1.068 \times 10^{-08}$ | −4.1 |
| 4 | 2.1 | 0.9 | 1.2 | 2.7 | $6.65 \times 10^{-09}$ | $3.29 \times 10^{-09}$ | $9.94 \times 10^{-09}$ | −10.7 |
| 4.5 | 2.1 | 0.9 | 1.2 | 2.7 | $6.53 \times 10^{-09}$ | $3.11 \times 10^{-09}$ | $9.64 \times 10^{-09}$ | −13.4 |
| 5 | 2.1 | 0.9 | 1.2 | 2.7 | $6.19 \times 10^{-09}$ | $2.88 \times 10^{-09}$ | $9.07 \times 10^{-09}$ | −18.5 |

Figure 10:
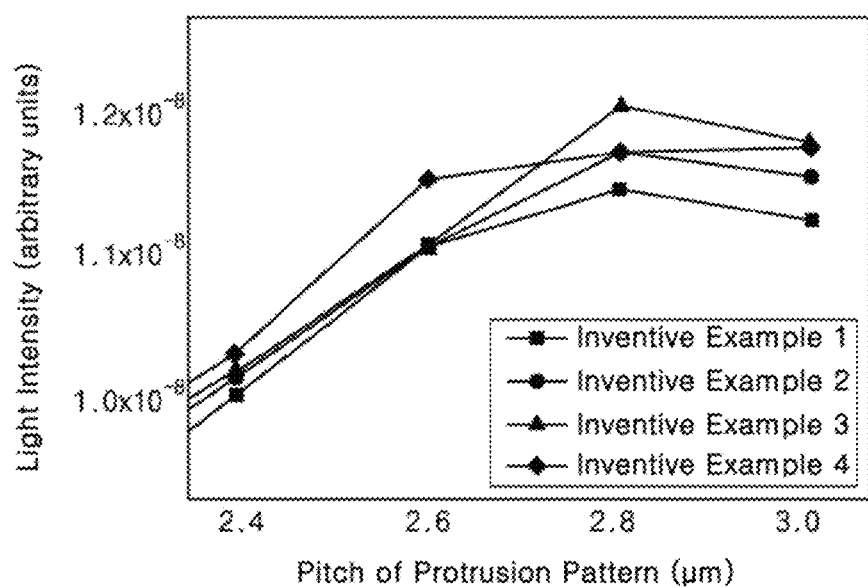
FIG. 10 is a graph showing light emission efficiency depending on diameters in Tables 3 through 6.

As described above, when the height and the diameter are constant, there is a difference in the amount of light depending on the pitches, and, when a ratio of the diameter of the protrusion to the pitch was within a range of about 0.8 to about 1.0, an increase rate of the amount of light was the largest. In particular, as shown in Table 1 and Table 2, the increase rate of amount of light was the highest at 3 μm although there are some differences depending on the height of the first layer and that of the second layer. Tables 3 through 6 are data showing light emission efficiency according to changes in diameters when the pitch and the height of the protrusion on the substrate are constant in the light emitting device. FIG. 10 is a graph showing light emission efficiency depending on diameters in Tables 3 through 6. In FIG. 10, the graphs shown as Inventive Examples 1 through 4 show the data in Tables 3 through 6, respectively.

TABLE 3

| Pitch (μm) | Height (μm) | Height of 1st layer (μm) | Height of 2nd layer (μm) | Diameter (μm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 3 | 2.1 | 0.4 | 1.7 | 2.6 | $7.80 \times 10^{-09}$ | $3.34 \times 10^{-09}$ | $1.11 \times 10^{-08}$ | 0.02 |
| 3 | 2.1 | 0.4 | 1.7 | 2.7 | $8.08 \times 10^{-09}$ | $3.38 \times 10^{-09}$ | $1.1462 \times 10^{-08}$ | 2.94 |
| 3 | 2.1 | 0.4 | 1.7 | 2.8 | $8.08 \times 10^{-09}$ | $3.38 \times 10^{-09}$ | $1.15 \times 10^{-08}$ | 2.94 |
| 3 | 2.1 | 0.4 | 1.7 | 3 | $7.94 \times 10^{-09}$ | $3.34 \times 10^{-09}$ | $1.13 \times 10^{-08}$ | 1.27 |

TABLE 4

| Pitch (μm) | Height (μm) | Height of 1st layer (μm) | Height of 2nd layer (μm) | Diameter (μm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 3 | 2.1 | 0.6 | 1.5 | 2.8 | $8.21 \times 10^{-09}$ | $3.47 \times 10^{-09}$ | $1.17 \times 10^{-08}$ | 4.92 |
| 3 | 2.1 | 0.6 | 1.5 | 3 | $8.11 \times 10^{-09}$ | $3.43 \times 10^{-09}$ | $1.15 \times 10^{-08}$ | 3.62 |

TABLE 5

| Pitch (µm) | Height (µm) | Height of $1^{st}$ layer (µm) | Height of 2nd layer (µm) | Diameter (µm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 3 | 2.1 | 0.9 | 1.2 | 2.7 | $8.49 \times 10^{-09}$ | $3.38 \times 10^{-09}$ | $1.1872 \times 10^{-08}$ | 6.6 |
| 3 | 2.1 | 0.9 | 1.2 | 2.8 | $8.67 \times 10^{-09}$ | $3.29 \times 10^{-09}$ | $1.20 \times 10^{-08}$ | 7.42 |
| 3 | 2.1 | 0.9 | 1.2 | 3   | $8.23 \times 10^{-09}$ | $3.52 \times 10^{-09}$ | $1.17 \times 10^{-08}$ | 5.51 |

TABLE 6

| Pitch (µm) | Height (µm) | Height of $1^{st}$ layer (µm) | Height of 2nd layer (µm) | Diameter (µm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 3 | 2.1 | 1.2 | 0.9 | 2.6 | $8.23 \times 10^{-09}$ | $3.29 \times 10^{-09}$ | $1.15 \times 10^{-08}$ | 3.47 |
| 3 | 2.1 | 1.2 | 0.9 | 2.8 | $8.36 \times 10^{-09}$ | $3.31 \times 10^{-09}$ | $1.17 \times 10^{-08}$ | 4.84 |
| 3 | 2.1 | 1.2 | 0.9 | 3   | $8.45 \times 10^{-09}$ | $3.27 \times 10^{-09}$ | $1.17 \times 10^{-08}$ | 5.24 |

As shown in Tables 3 through 5, and FIG. 10, when the diameter of the protrusion was 2.8 µm, luminous efficiency was relatively high regardless of the pitch and height, and in particular, when the ratio of the first layer to the second layer was 0.75, the greatest luminous efficiency was exhibited.

Tables 7 through 10 are data showing light emission efficiency according to changes in heights of the first layer and the second layer when the pitch and the diameter of the protrusions on the substrate are constant in the light emitting device.

TABLE 7

| Pitch (µm) | Height (µm) | Height of $1^{st}$ layer (µm) | Height of 2nd layer (µm) | Diameter (µm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 3 | 2.1 | 1.2 | 0.9 | 2.6 | $8.23 \times 10^{-09}$ | $3.29 \times 10^{-09}$ | $1.15 \times 10^{-08}$ | 3.47 |
| 3 | 2.1 | 0.4 | 1.7 | 2.6 | $7.80 \times 10^{-09}$ | $3.34 \times 10^{-09}$ | $1.11 \times 10^{-08}$ | 0.02 |

TABLE 8

| Pitch (µm) | Height (µm) | Height of $1^{st}$ layer (µm) | Height of 2nd layer (µm) | Diameter (µm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 3 | 2.1 | 0.9 | 1.2 | 2.7 | $8.49 \times 10^{-09}$ | $3.38 \times 10^{-09}$ | $1.1872 \times 10^{-08}$ | 6.6 |
| 3 | 2.1 | 0.4 | 1.7 | 2.7 | $8.08 \times 10^{-09}$ | $3.38 \times 10^{-09}$ | $1.1462 \times 10^{-08}$ | 2.94 |

TABLE 9

| Pitch (µm) | Height (µm) | Height of $1^{st}$ layer (µm) | Height of 2nd layer (µm) | Diameter (µm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 3 | 2.1 | 1.2 | 0.9 | 2.8 | $8.36 \times 10^{-09}$ | $3.31 \times 10^{-09}$ | $1.17 \times 10^{-08}$ | 4.84 |
| 3 | 2.1 | 0.9 | 1.2 | 2.8 | $8.67 \times 10^{-09}$ | $3.29 \times 10^{-09}$ | $1.20 \times 10^{-08}$ | 7.42 |
| 3 | 2.1 | 0.6 | 1.5 | 2.8 | $8.21 \times 10^{-09}$ | $3.47 \times 10^{-09}$ | $1.17 \times 10^{-08}$ | 4.92 |
| 3 | 2.1 | 0.4 | 1.7 | 2.8 | $8.08 \times 10^{-09}$ | $3.38 \times 10^{-09}$ | $1.15 \times 10^{-08}$ | 2.94 |

TABLE 10

| Pitch (μm) | Height (μm) | Height of 1st layer (μm) | Height of 2nd layer (μm) | Diameter (μm) | Amount of light in the upper direction (arbitrary unit) | Amount of light in the side direction (arbitrary unit) | Total amount of emitted light (arbitrary unit) | Increase/decrease rate of the amount of light (%) |
|---|---|---|---|---|---|---|---|---|
| 3 | 2.1 | 1.2 | 0.9 | 3 | $8.45 \times 10^{-09}$ | $3.27 \times 10^{-09}$ | $1.17 \times 10^{-08}$ | 5.24 |
| 3 | 2.1 | 0.9 | 1.2 | 3 | $8.23 \times 10^{-09}$ | $3.52 \times 10^{-09}$ | $1.17 \times 10^{-08}$ | 5.51 |
| 3 | 2.1 | 0.6 | 1.5 | 3 | $8.11 \times 10^{-09}$ | $3.43 \times 10^{-09}$ | $1.15 \times 10^{-08}$ | 3.62 |
| 3 | 2.1 | 0.4 | 1.7 | 3 | $7.94 \times 10^{-09}$ | $3.34 \times 10^{-09}$ | $1.13 \times 10^{-08}$ | 1.27 |

Referring to Table 7 and Table 8, there was a difference in the increase/decrease rate of the amount of light according to the heights of the first layer and the second layer, and overall, when the height of the second layer was higher than that of the first layer, the increase/decrease rate of the amount of light is large, but some were not. As described above, the present disclosure provides the light emitting device having a significantly higher light emission efficiency by differently setting the diameter of the protrusions on the substrate, the height of the protrusions, and the pitches of the protrusion pattern.

Figure 11:
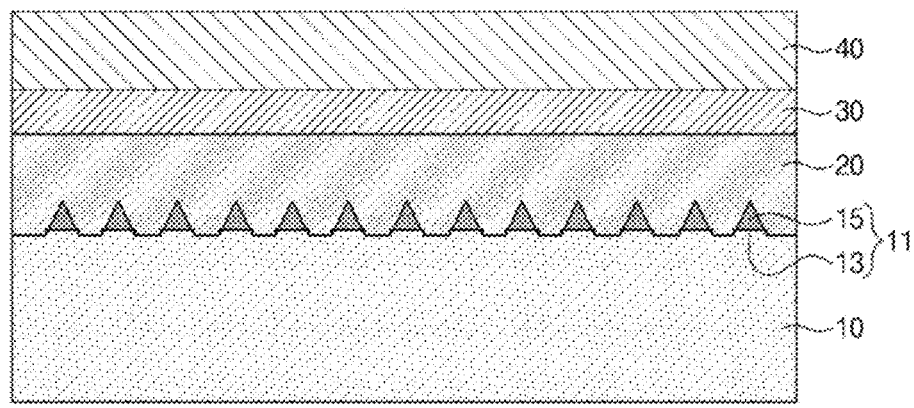
FIG. 11 is a schematic cross-sectional view illustrating a light emitting device according to an exemplary embodiment.

FIG. 11 is a schematic cross-sectional view illustrating a light emitting device according to an exemplary embodiment.

In the following exemplary embodiments, to avoid repeated descriptions, differences from the above-described exemplary embodiments are mainly described, and undescribed parts follow the above-described exemplary embodiments or matters which are obvious to those skilled in the art.

Referring to FIG. 11, the light emitting device according to an exemplary embodiment includes the substrate 10 and a light emitting stack provided on the substrate 10. The light emitting stack includes the first semiconductor layer 20, the active layer 30, and the second semiconductor layer 40 which are sequentially provided on the substrate 10. In an exemplary embodiment of the present disclosure, the substrate 10 is patterned, and a pattern of a plurality of protrusions 11 is provided on an upper surface thereof. The first semiconductor layer 20 may be provided on the substrate 10. The first semiconductor layer 20 may cover the protrusions 11 on the substrate 10. For this purpose, the first semiconductor layer 20 may be epitaxially grown from the upper surface of the substrate 10, and in this case, the first semiconductor layer 20 may be grown in an upper direction so as to completely cover side and upper surfaces of the protrusions 11. The first semiconductor layer 20 has a plurality of voids at a location corresponding to the side of the protrusion 11. This will be described later.

Figure 12:
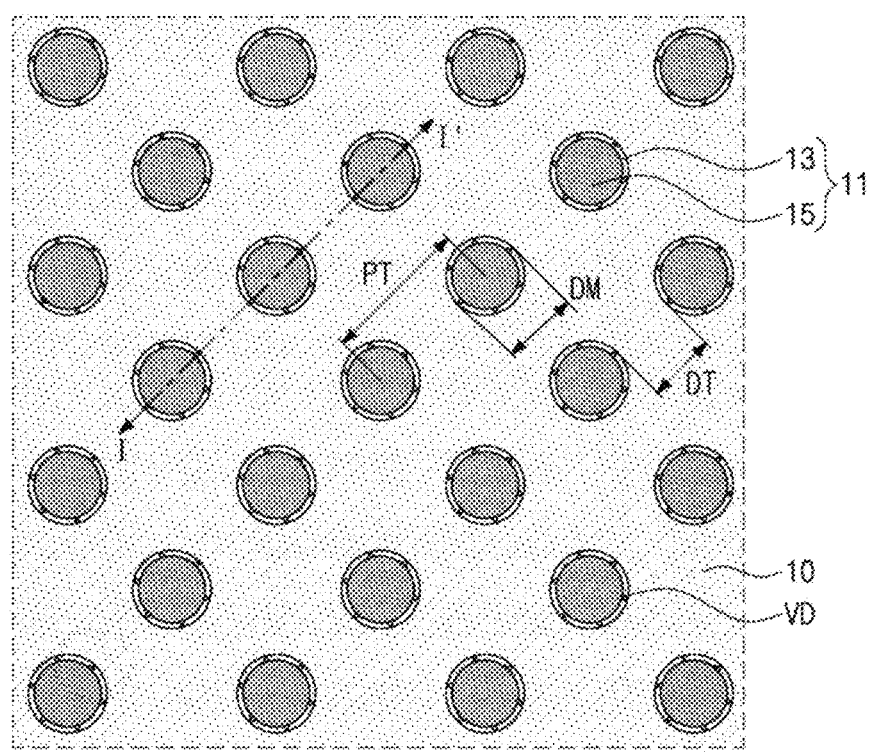
FIG. 12 is a plan view of the substrate with a protrusion pattern provided thereon among elements of the light emitting device of FIG. 11.
Figure 13:
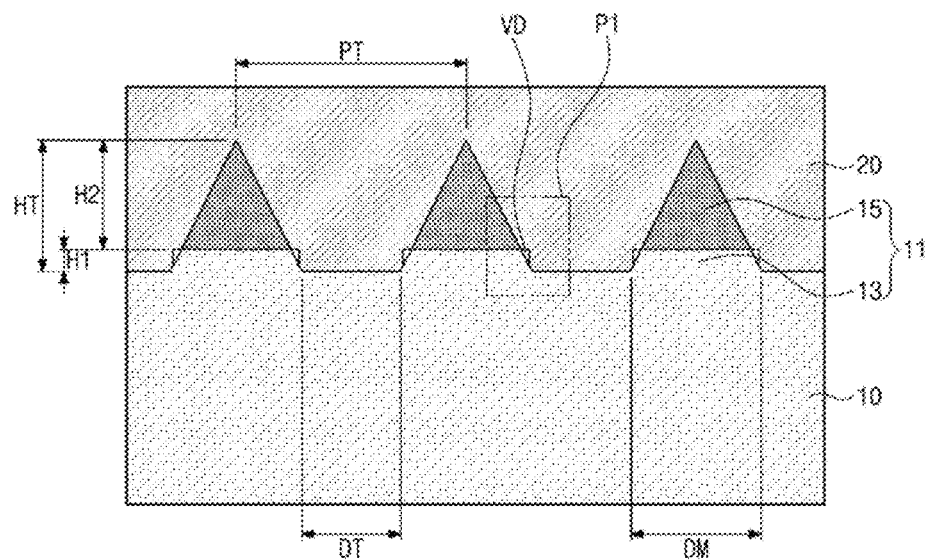
FIG. 13 is a cross-sectional view taken along line I-I' of FIG. 12.
Figure 14:
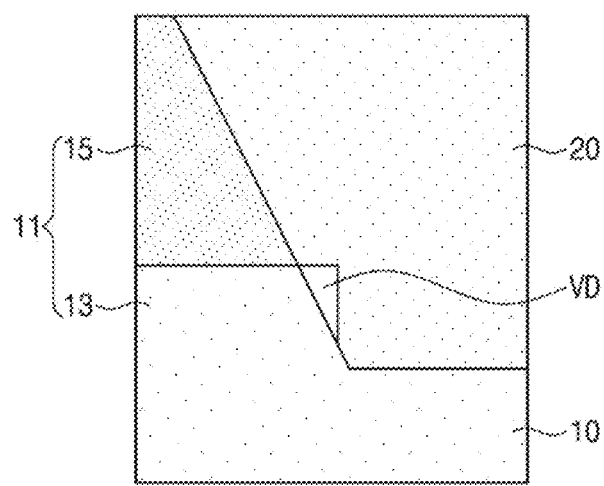
FIG. 14 is an enlarged cross-sectional view of P1 of FIG. 13.

FIG. 12 is a plan view of the substrate with protrusions provided thereon among elements of the light emitting device of FIG. 11, FIG. 13 is a cross-sectional view taken along line I-I' of FIG. 12, and FIG. 14 is an enlarged cross-sectional view of P1 of FIG. 13.

Referring to FIGS. 12 through 14, the protrusions 11 including the first layer 13 and the second layer 15 on the upper surface of the substrate 10 are provided, and a plurality of voids VD adjacent to the protrusion 11 is provided.

In an exemplary embodiment of the present disclosure, a pitch PT of the pattern of the protrusions 11 may have a value within a predetermined range according to a diameter DM. For example, a ratio of the diameter DM of the protrusion 11 to the pitch PT thereof may be in a range of about 0.3 to about 2.0. However, the ratio of the diameter DM of the protrusion 11 to the pitch PT thereof is not limited thereto, and may be provided in other numerical values.

In an exemplary embodiment of the present disclosure, the plurality of voids VD is formed on the side of the protrusion 11, that is, between the protrusion 11 and the first semiconductor layer 20. In particular, the voids VD are formed near an edge of an interface between the first layer 13 and the second layer 15 of the protrusion 11. The voids VD have a shape extending in a lower direction of an extended surface with respect to the extended surface of the interface between the first layer 13 and the second layer 15, that is, a direction toward the substrate 10. As such, the voids VD are formed on at least one side along an outer edge of an uppermost portion of the first layer 13, as shown in FIG. 14. The voids VD formed here are not defects and fully intended to be formed because the voids VD may improve light extraction efficiency.

Herein, the voids VD are formed corresponding to a direction of growing a crystal surface, and is formed at a side corresponding to each vertex of the hexagon (see FIG. 19) based on a center of the protrusion 11. Each of the voids VD may have a triangular shape when viewed on a plane. In more detail, when the protrusion 11 is provided in a conical shape, an upper surface of the first layer 13 has a circular shape, and in this case, the voids VD, when viewed on a plane, are provided corresponding to vertexes of a regular hexagon inscribed in the circle. (See FIG. 19). The voids VD, when cut along a plane perpendicular to the upper surface of the substrate 10 and passing through a center of the circle, may have a right triangle shape. In this case, in the right triangle shape, a hypotenuse thereof may be a side surface of the first layer 13. In addition, in each of the voids VD, a surface forming an uppermost portion of the void VD may be substantially the same surface as the surface extending the upper surface of the first layer 13. That is, each of the voids VD is formed in the first semiconductor layer 20 corresponding to an outer side of the upper surface of the first layer 13, and the upper surface of the first layer 13 is an upper surface of a structure forming each of the voids VD.

According to an exemplary embodiment of the present disclosure, the first semiconductor layer 20 undergoes a process of merging into one crystal while growing in an upper direction and/or a side direction from the upper surface of the substrate 10. A portion that is not in close contact with the side surface of the first layer 13 of the protrusion 11 is formed in the merging process, and as a result, the voids VD may be formed, as shown in FIG. 5A.

The voids VD are empty spaces that are outside of the first layer 13 and the first semiconductor layer 20. As such, the voids VD have different refractive indices from those of the first layer 13 and the first semiconductor layer 20. Light refraction, scattering, reflection, or the like occurs on an interface between the first layer 13 and each of the voids, and thus, light extraction efficiency by the voids is improved. However, in general, an increase in light refraction, scattering, reflection, or the like improves light extraction efficiency, but when a location where the voids VD is generated is too close or too far from the upper surface of the substrate 10, the light extraction efficiency may be reduced.

According to an exemplary embodiment of the present disclosure, to increase the light extraction efficiency by the voids VD, heights of the first layer 13 and the second layer 15 in the protrusion 11 are maintained within a predetermined range. As described above, since the locations of the voids VD are provided at locations corresponding to the interface between the first layer 13 and the second layer 15, the locations of the voids may also be adjusted by adjusting the locations of the first layer 13 and the second layer 15 to a specific range. Herein, a height H1 of the first layer 13 is formed to have a value greater than or equal to a predetermined value. When the height H1 of the first layer 13 is 0, growth of the first semiconductor layer 20 from the substrate 10 may be impeded by impurities remaining on the upper surface of the substrate 10 during a process. Further, when a height H2 of the second layer 15 has a larger value than the height H1 of the first layer 13, since the quality of the crystal may be improved by decreasing growth of crystals in a direction of the side surface of the first layer 13, the height of the second layer 15 may have a larger value than that of the first layer 13.

In other words, to sufficiently improve the light extraction efficiency by the voids VD, the heights of the first layer 13 and the second layer 15 and the locations of the voids VD locations corresponding to the interface between the first layer 13 and the second layer 15 may be within a predetermined range. For example, the ratio of the height of the first layer 13 to that of the second layer 15 may be greater than about 2.5 and less than about 9.5, and, in an exemplary embodiment, a ratio of the height of the first layer 13 to that of the second layer 15 may be about 4.25. Specifically, for example, when a sum of the heights of the first layer 13 and the second layer 15 is about 2.1 µm, the first layer 13 may have the height of greater than about 0.2 µm and less than about 0.6 µm. In another exemplary embodiment, when the sum of the heights of the first layer 13 and the second layer 15 is about 2.1 µm, the first layer 13 may have the height of about 0.25 µm or more and about 0.55 µm or less, and in another exemplary embodiment, the first layer 13 may have the height of about 0.3 µm or more and about 0.5 µm or less.

In case where the height of the first layer 13 is smaller than the above-mentioned range from the surface of the substrate 10, the voids VD are not sufficiently formed, and even if the voids VD are formed, the scattering effect of light by the voids VD may not be sufficiently exhibited. In addition, sizes of the voids VD are small or the voids VD are not sufficiently formed, which may be considered as a defect, and thus, the transmittance of light passing through the voids VD may be reduced. In this case, as a result, the incident ratio of light from the first semiconductor layer 20 to a direction of the inside of the substrate 10 may be reduced.

When the height of the first layer 13 is within the above-described range from the surface of the substrate 10, i.e., about 0.2 µm and less than about 0.6 µm, the voids VD are sufficiently formed, the scattering effect by the voids VD is increased, and the ratio of light incident from the first semiconductor layer 20 through the voids VD in the direction of the substrate 10 increases. In particular, in addition to light directly incident on the substrate 10 from the first semiconductor layer 20, an overall light emission efficiency is improved because light additionally passes through the surface of the substrate 10 after passing through the voids VD and being refracted.

In case that the height of the first layer 13 is larger than the above-described range from the surface of the substrate 10, for light proceeding from the first semiconductor layer 20 to the direction toward the substrate 10, a path of light proceeding to the inside of the substrate 10 increases. An absorption rate of light in the substrate 10 may increase, and thus, an amount of light passing through the substrate 10 may be reduced. In addition, in this case, since the height of the first layer 13 becomes relatively high, growth of crystals may occur in the direction of the side surface of the first layer 13 and the quality of the crystals may be reduced, which causes a decrease in light efficiency.

In the light emitting device having the above structure, light extraction efficiency is improved by the protrusion pattern and the voids.

Table 11 is a simulation result showing light extraction efficiency of light emitting devices having a structure where voids are not provided and light emitting devices having a structure where voids are provided. Each light emitting device was provided with the same structure and size in pairs, except for the presence or absence of voids. Herein, the light emitting devices are prepared in a flip chip type. The light extraction efficiency was measured by measuring brightness of light passing through the substrate, and a proceeding direction of light was set to pass through a first semiconductor layer from an active layer.

Figure 15A:
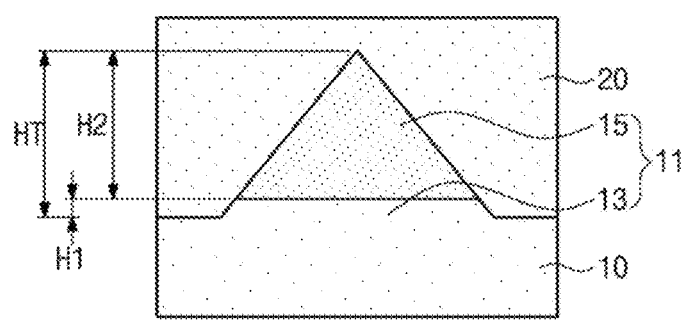
FIG. 15A shows conventional structures of protrusions of light emitting devices in which voids are not provided and an upper surface of a first layer is disposed very close to a substrate surface.
Figure 15B:
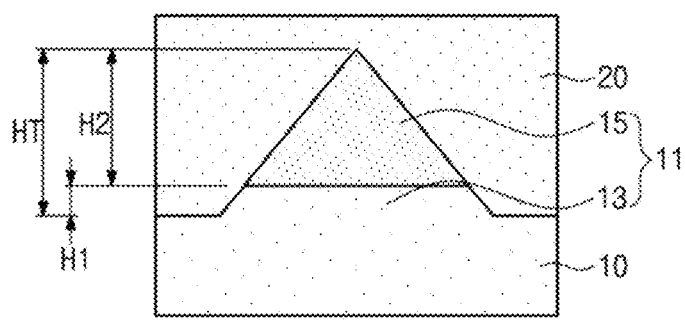
FIG. 15B shows conventional structures of protrusions of light emitting devices in which voids are not provided and heights of the first layer and a second layer differ from FIG. 15A.

Herein, the extraction efficiency of the light emitting devices was measured while changing the structure of the protrusion pattern, that is, changing heights of a first layer and those of a second layer, respectively. The structures of the protrusions of the devices without voids are shown in FIGS. 15A through 15D, and the structures of the protrusions provided with voids are shown in FIGS. 16A through 16D. Drawings in FIGS. 15A through 15D and in FIGS. 16A through 16D do not fully match a scale of actual simulation conditions, and some drawings are exaggerated or reduced for convenience of description. FIG. 17 is a graph showing simulation results in Table 11 where x-axis keys, 1 through 8 correspond to Comparative Examples 1-4 and Inventive Examples 1-4, respectively, as indicated in FIG. 17. For convenience of description, the structures in FIGS. 15A through 15B are shown as Comparative Examples 1 through 4, and the structures in FIGS. 16A through 16D are shown as Inventive Examples 1 through 4.

TABLE 11

Figure 15C:
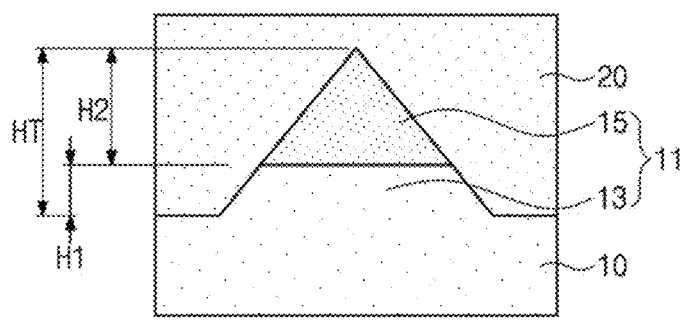
FIG. 15C shows conventional structures of protrusions of light emitting devices in which voids are not provided and heights of the first layer and a second layer differ from FIGS. 15A and 15B
Figure 15D:
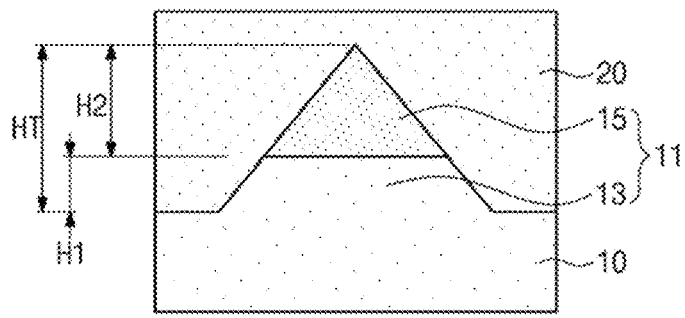
FIG. 15D shows conventional structures of protrusions of light emitting devices in which voids are not provided and heights of the first layer and a second layer differ from FIGS. 15A through 15C.
Figure 16A:
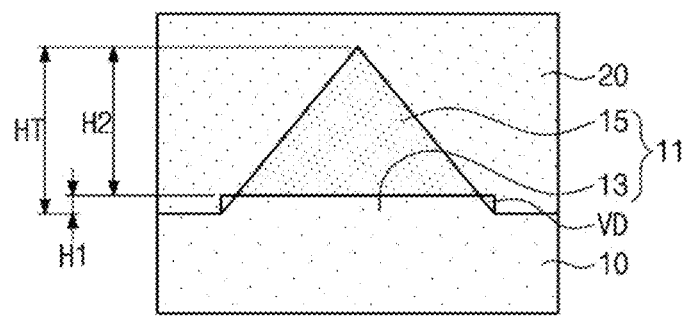
FIG. 16A shows structures of protrusions of light emitting devices according to one or more embodiments of the present disclosure in which corresponds to FIG. 15A for comparison but voids are provided.
Figure 16B:
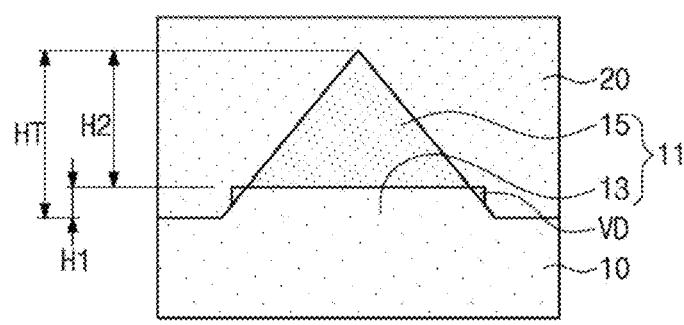
FIG. 16B shows structures of protrusions of light emitting devices according to one or more embodiments of the present disclosure in which corresponds to FIG. 15B for comparison but voids are provided.
Figure 16C:
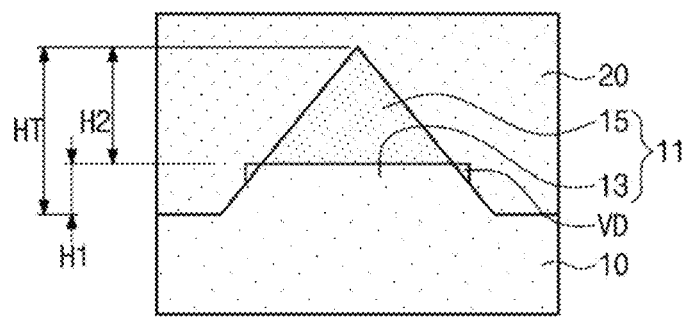
FIG. 16C shows structures of protrusions of light emitting devices according to one or more embodiments of the present disclosure in which corresponds to FIG. 15C for comparison but voids are provided.
Figure 16D:
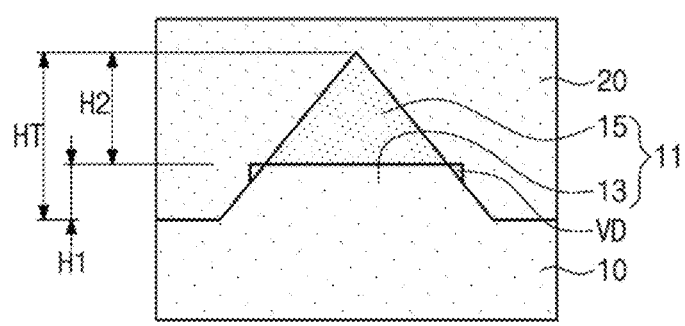
FIG. 16D shows structures of protrusions of light emitting devices according to one or more embodiments of the present disclosure in which corresponds to FIG. 15C for comparison but voids are provided.
Figure 17:
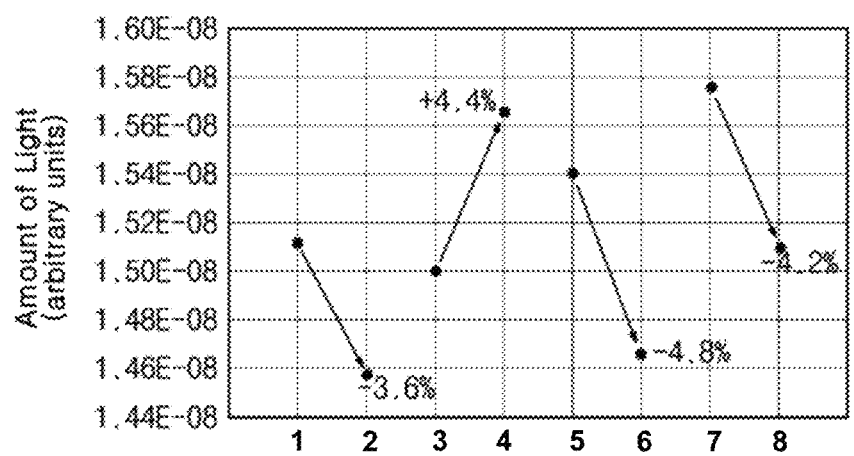
FIG. 17 is a graph showing simulation results in Table 11.

| Number | Structure | Corresponding FIG. | Height (μm) 1st layer | Height (μm) 2nd layer | Pitch (μm) | Diameter (μm) | Amount of emitted light in the upper direction (arbitrary unit) | Amount of emitted light in the side direction (arbitrary unit) | Total amount of emitted light (arbitrary unit) | Change in Light efficiency (%) |
|---|---|---|---|---|---|---|---|---|---|---|
| 1 | Comparative Example 1 | FIG. 15A | 0.2 | 1.9 | 3 | 2.7 | $1.13 \times 10^{-8}$ | $3.81 \times 10^{-9}$ | $1.5114 \times 10^{-8}$ | 0.0 |
|   | Inventive Example 1 | FIG. 16A | 0.2 | 1.9 | 3 | 2.7 | $1.11 \times 10^{-8}$ | $3.47 \times 10^{-9}$ | $1.4573 \times 10^{-8}$ | −3.6 |
| 2 | Comparative Example 2 | FIG. 15B | 0.4 | 1.7 | 3 | 2.7 | $1.13 \times 10^{-8}$ | $3.70 \times 10^{-9}$ | $1.5000 \times 10^{-8}$ | 0.0 |
|   | Inventive Example 2 | FIG. 16B | 0.4 | 1.7 | 3 | 2.7 | $1.18 \times 10^{-8}$ | $3.86 \times 10^{-9}$ | $1.5659 \times 10^{-8}$ | +4.4 |
| 3 | Comparative Example 3 | FIG. 15C | 0.6 | 1.5 | 3 | 2.7 | $1.15 \times 10^{-8}$ | $3.90 \times 10^{-9}$ | $1.54044 \times 10^{-8}$ | 0.0 |
|   | Inventive Example 3 | FIG. 16C | 0.6 | 1.5 | 3 | 2.7 | $1.08 \times 10^{-8}$ | $3.86 \times 10^{-9}$ | $1.4659 \times 10^{-8}$ | −4.8 |
| 4 | Comparative Example 4 | FIG. 15D | 0.9 | 1.2 | 3 | 2.7 | $1.19 \times 10^{-8}$ | $3.86 \times 10^{-9}$ | $1.5759 \times 10^{-8}$ | 0.0 |
|   | Inventive Example 4 | FIG. 16D | 0.9 | 1.2 | 3 | 2.7 | $1.14 \times 10^{-8}$ | $3.70 \times 10^{-9}$ | $1.5100 \times 10^{-8}$ | −4.2 |

Referring to Table 11, in a case of Comparative Example 1 and Inventive Example 1, a height of the first layer is 0.2 μm, which corresponds to a case where an upper surface of the first layer is disposed very close to the substrate surface. Looking at Comparative Example 1 (a conventional light emitting device in which the voids are not provided) and Inventive Example 1, (the light emitting device in which the voids are provided), an amount of light transmitted through the substrate is reduced, and in particular, an overall light efficiency was rather reduced to −3.6%. It may result from the fact that the voids are not sufficiently formed due to the low height of the first layer, and even if the voids are formed, the scattering effect of light by the voids is not sufficiently exhibited. In Comparative Examples 3 and Inventive Example 3, and in Comparative Examples 4 and Inventive Example 4, in the light emitting device provided with the voids is compared to the conventional light emitting device without the voids. The amount of light transmitted through the substrate was also reduced, in particular, the overall light efficiency rather decreased to −4.8% and −4.2%. This is because, when the height of the first layer is larger than the above-mentioned range from the substrate surface, for light proceeding from the first semiconductor layer to the substrate through the voids, a path of light proceeding through the substrate is increased, and thus, the absorption rate of light in the substrate is increased. In comparison, in a case of Comparative Example 2 and Inventive Example 2, in the light emitting devices provided with the voids, the amount of light transmitted through the substrate was increased by 4.4%, compared to the conventional light emitting device without the voids. This is because the voids are sufficiently formed due to the sufficient height of the first layer, and side effects, for example, a decrease in crystallinity or an increase in light absorption due to an increase in the optical path in the substrate, or the like, may occur when the first layer is too high. Accordingly, when the voids are formed as those in Inventive Example 2, in addition to light directly incident on the substrate from the first semiconductor layer, an overall light emission efficiency is improved because light additionally passes through the substrate surface after passing through the voids and being refracted.

Through the above description, when the voids are provided on the side of the protrusion, and the heights of the first layer and the second layer are within the above-described range, i.e., between 0.2 μm and 0.6 μm, the light efficiency is significantly increased. In particular, when the voids are provided on the sides of the protrusion, and the sum of the heights of the first layer and the second layer is 2.1 μm, and the height of the first layer is between 0.2 μm and 0.6 μm, the light efficiency is significantly increased.

The light emitting device having the structure according to the above-described exemplary embodiment may be manufactured by adjusting the process conditions such that a plurality of voids is formed on the side of the protrusion when forming the first semiconductor layer.

Figure 18A:
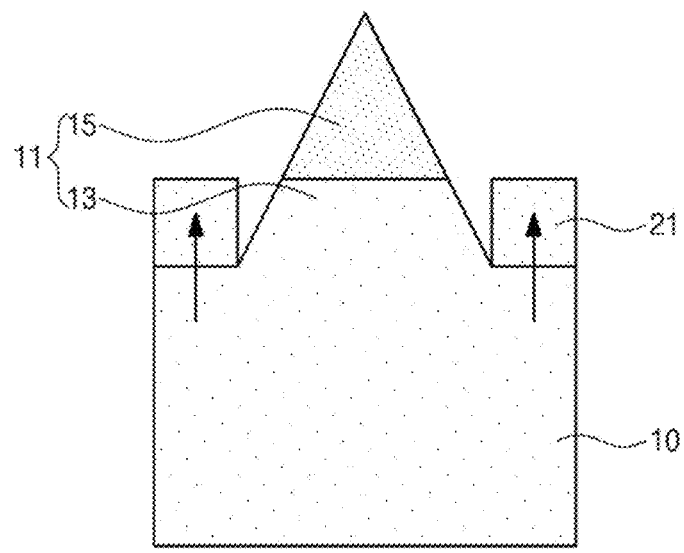
FIG. 18A is a cross-sectional view illustrating a substrate formed with a protrusion pattern where voids are formed.
Figure 18B:
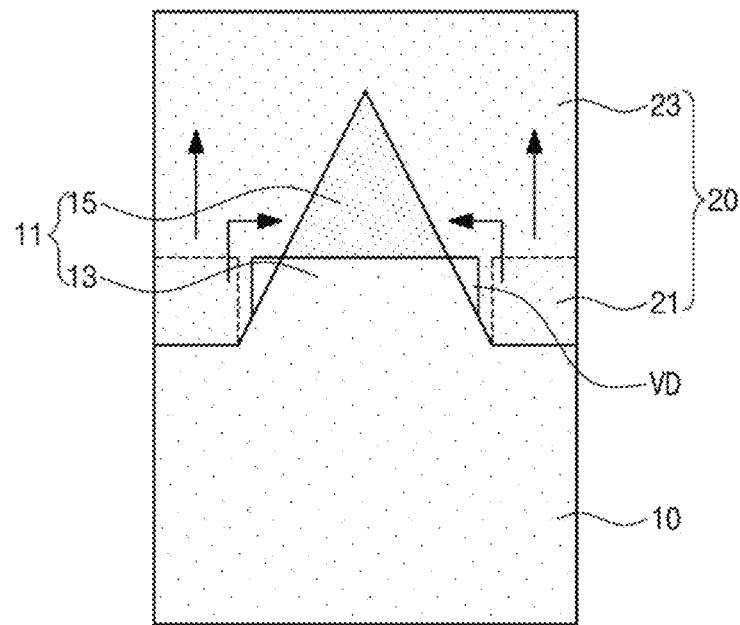
FIG. 18B is a cross-sectional view illustrating growing of a first semiconductor layer.

FIG. 18A and FIG. 18B are cross-sectional views illustrating some of manufacturing steps of a protrusion pattern having the above-described structure, showing a substrate formed with the protrusion pattern thereon so that a void is formed and sequentially showing a direction of growing a first semiconductor layer. In FIG. 18A and FIG. 18B, a main direction of growing the semiconductor layer is indicated by arrows for convenience of description.

Referring to FIGS. 11 through 14, FIG. 18A, and FIG. 18B, the first semiconductor layer 20 is formed in the upper direction.

The first semiconductor layer 20 may be formed of a semiconductor layer of various materials, for example, an n-type nitride-based semiconductor layer, and may be formed using an organic metal vapor phase epitaxy or molecular beam epitaxy (MBE) or hydride vapor phase epitaxy (HVPE) method.

An initial growth of the first semiconductor layer 20 is 3D growth (e.g., Volmer-Weber growth) mainly occurring in the upper direction from an exposed surface of the substrate 10, and growth does not occur on an upper surface of the second layer 15. Conditions for 3D growth have a relatively low growth temperature and high growth pressure compared to those of 2D growth (e.g., Frank van der Merwe growth) where growth mainly occurs in the horizontal direction.

After the first semiconductor layer 20 is partially grown in the upper direction, the first semiconductor layer 20 is grown in the upper and side directions. In FIG. 18B, for convenience of description, it is illustrated by dividing a first growth pattern 21 which is mainly grown in the upper direction and a second growth pattern 23 which is grown in the upper direction and in a direction of a side surface, but dominantly grown in the direction of the side surface. At this time, in the case of the second growth pattern 23, 2D growth in which growth mainly occurs in the horizontal direction, can be achieved by maintaining a growth temperature higher and a growth pressure lower than those of the above-described 3D growth.

In an exemplary embodiment of the present disclosure, for the growth in the side direction (horizontal direction in the drawing) of the first semiconductor layer 20, epitaxial lateral over-growth (ELOG) may be used as a metal-organic chemical vapor deposition (MOCVD) method.

The first semiconductor layer 20 is merged to cover an entire surface of the substrate 10 including the surface of the second layer 15 by continuously growing in the direction of the side surface and the upper direction. The first semiconductor layer 20 undergoes a process of merging into one crystal while growing in the upper direction from the substrate surface and/or the direction of the side surface. A portion that is not in close contact with the side surface of the first layer 13 of the protrusion 11 is formed in the merging process and as a result, the voids VD may be formed. Herein, in particular, a thickness ratio of the first semiconductor layer 20 according to each growth during 3D growth and 2D growth is adjusted, and thus, a size and a location of the voids VD formed in the first semiconductor layer 20 may be determined in advance.

In an exemplary embodiment of the present disclosure, the upper surface of the exposed substrate 10 between the protrusions 11 is a portion that becomes a substantial growth nucleus, and growth occurs in the upper direction from the upper surface of the substrate 10 like the first growth pattern 21. Thereafter, the first semiconductor layer 20 is grown along the side direction by the ELOG method like the second growth pattern 23. In growth of first semiconductor layer 20, a surface of the first semiconductor layer 20 growing in the upper direction may be referred to as an upper surface and a surface of the first semiconductor layer 20 growing in the side direction may be referred to as a side surface. When the first semiconductor layer 20 is epitaxially grown by ELOG, growth of the side surface occurs more dominantly than growth of the upper surface due to conditions of ELOG, and the growth ratio of an m-axis and a c-axis is about 2:1. When growing, the side surface of the first semiconductor layer 20 may be perpendicular to the upper surface of the first semiconductor layer 20, but the inventive concepts are not limited thereto, and it may be a facet surface inclined to the upper surface of the first semiconductor layer 20. In an exemplary embodiment, the upper surface of the first semiconductor layer 20 may correspond to (0001) plane, and the side surface of the first semiconductor layer 20 may correspond to (10-11) plane.

After entirely forming the first semiconductor layer 20 through growing in the side direction, selectively, the first semiconductor layer 20 may be further grown in the upper direction using HVPE. When forming the first semiconductor layer 20 by using MOCVD, since a deposition rate thereof is slower than that of HVPE, HVPE may be used when the first semiconductor layer 20 is to be grown quickly to have a sufficient thickness.

The first semiconductor layer 20 formed as described above covers the surface of the substrate 10 and the protrusions 11 in a state in which the voids are formed.

In an exemplary embodiment of the present disclosure, a buffer layer may be further formed on the substrate 10 before forming the first semiconductor layer 20. In an exemplary embodiment, a superlattice structure may be formed by alternately stacking two types of layers having different band gaps on the first semiconductor layer 20. The active layer 30 is formed on the first semiconductor layer 20. In an exemplary embodiment, a quantum well structure may be formed by alternately stacking a quantum well layer and a barrier layer as the active layer 30. An electron blocking layer may be formed on the active layer 30, and then, a second semiconductor layer 40 may be formed on the active layer 30, and thus, a light emitting stack may be manufactured.

Figure 19:
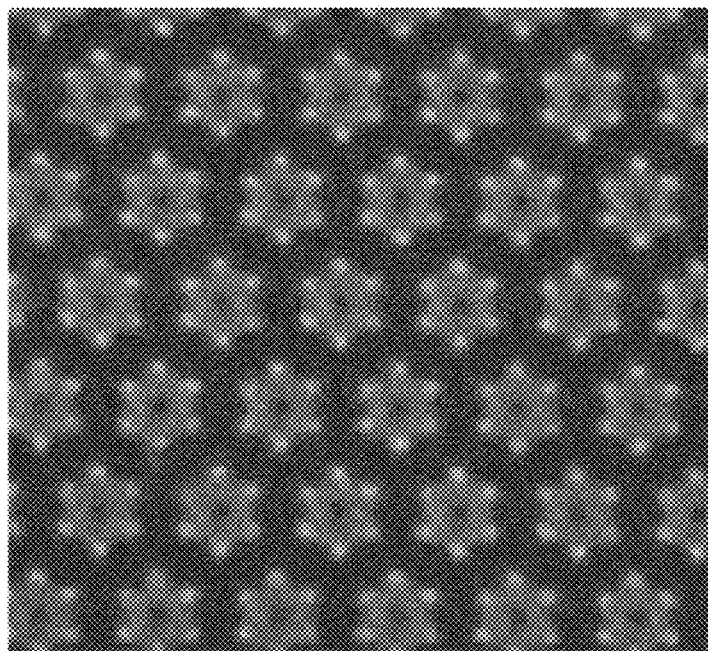
FIG. 19 is a photograph of a protrusion pattern and a first semiconductor layer according to an exemplary embodiment manufactured by the above-described method.

FIG. 19 is a photograph showing protrusions and a first semiconductor layer according to an exemplary embodiment manufactured by the above-described method. As illustrated in FIG. 19, in the light emitting device according to an exemplary embodiment, a plurality of protrusions may be formed on a substrate, and six voids are provided for each protrusion. Each void is provided at a location corresponding to a vertex of the hexagon, which is related to a direction of growing a crystal of the semiconductor layer.

Figure 20A:
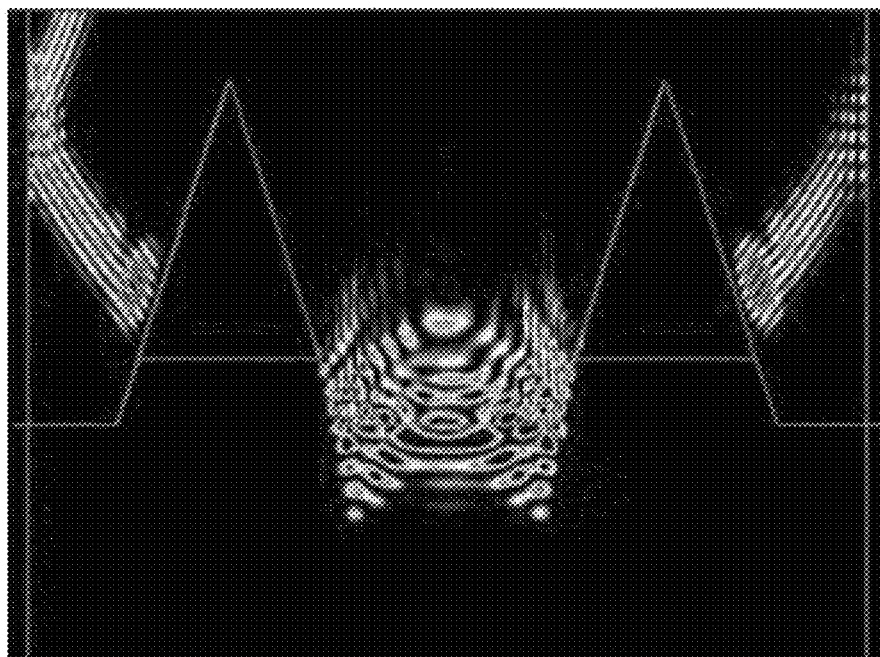
FIG. 20A is a photograph of light paths and intensities of light of a light emitting device having a structure in which voids are not provided.
Figure 20B:
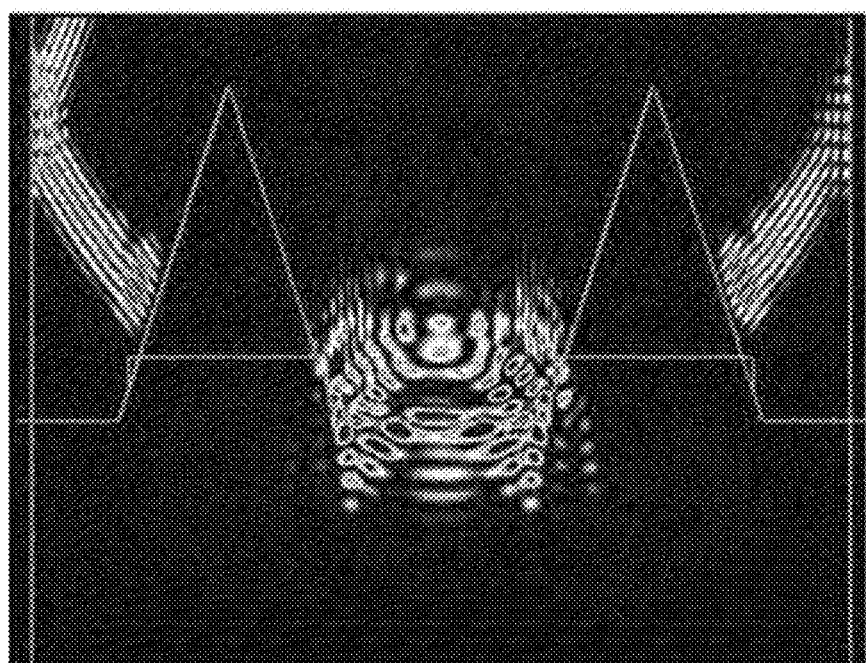
FIG. 20B is a photograph of light paths and intensities of light of a light emitting device having a structure in which voids are provided.

FIG. 20A and FIG. 20B are photographs showing light paths and intensities of light of light emitting devices having a structure in which voids are not provided and light emitting devices having a structure in which voids are provided, respectively. In FIG. 20A and FIG. 20B, when a direction in which the vertex of the protrusion in the drawing is referred to as an upper side, a proceeding direction of light is from the upper side to a lower side.

Referring to FIG. 20A and FIG. 20B, light proceeding from the upper side to the lower side is incident to the lower side of the substrate through an inclined surface of the protrusion and the substrate surface. Referring to FIG. 20B, when the void is provided on a side of the protrusion, it can be clearly seen that light refracted and scattered through the void enters the lower direction of the substrate, and a degree thereof is significantly larger than that of FIG. 20A in which no voids are provided.

As described above, by forming the voids in the first semiconductor layer of a region corresponding to the side of the protrusion, an amount of light proceeding in the lower direction may be significantly increased, and as a result, the light emitting device having high light efficiency may be manufactured.

The light emitting device according to an exemplary embodiment of the present disclosure may be employed in various types of semiconductor chips, for example, may be employed in semiconductor chips of the types shown in FIG. 6 and FIG. 7, or may be employed in semiconductor chips of types described below.

Figure 21:
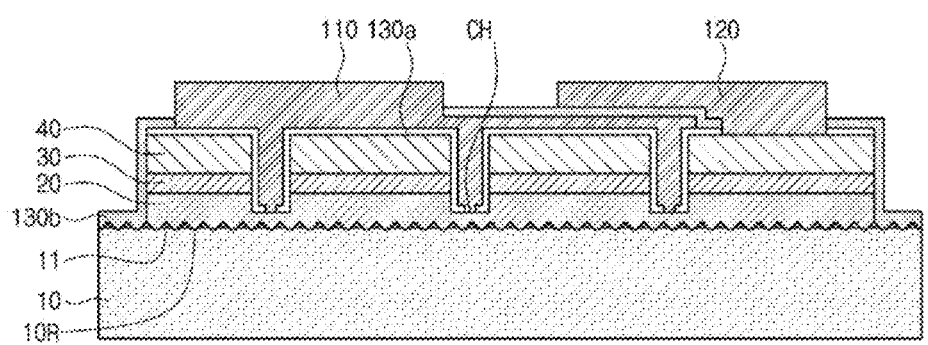
FIG. 21 is a cross-sectional view illustrating a semiconductor chip according to an exemplary embodiment.

FIG. 21 is a cross-sectional view illustrating a semiconductor chip according to an exemplary embodiment, showing a flip-chip type semiconductor chip. Since the flip-chip type semiconductor is formed on a substrate and then inverted and mounted on other elements, the flip-chip type semiconductor is shown in an inverted form in the drawing.

Referring to FIG. 21, the light emitting device includes a substrate 10, a light emitting stack provided on an upper surface 10R of the substrate 10, and first and second electrodes 110 and 120 connected to the light emitting stack.

In an exemplary embodiment of the present disclosure, the substrate 10 is patterned, and a plurality of protrusions and voids are provided on the upper surface thereof.

The light emitting stack includes a first semiconductor layer 20, an active layer 30, and a second semiconductor layer 40 which are sequentially stacked on the upper surface 10R of the substrate 10. In the exemplary embodiment, the light emitting stack may be provided in at least one mesa form including the active layer 30 and the second semiconductor layer 40. When the light emitting stack is provided in a form of a mesa, the light emitting stack may include the pattern of the plurality of protrusions, and the protrusions may be spaced apart from one another.

As shown in FIG. 21, an insulation film 130a is provided on the light emitting stack. At least one contact hole CH passing through the active layer 30, the second semiconductor layer 40, and the insulation film 130a to expose a portion of the first semiconductor layer 20 is provided in the light emitting stack. The first electrode 110 is connected to the first semiconductor layer 20 exposed through the contact hole CH. The second electrode 120 is connected to the second semiconductor layer 40 exposed through an opening formed in the insulation film 130a. An additional insulation film 130b may be further provided on a side of the light emitting stack, as shown in FIG. 21. The additional insulation film 130b may be formed of various types of mirrors (for example, metal mirrors or dielectric mirrors) so that light emitted from the active layer 30 does not emit in a direction of the side of the light emitting stack.

In the light emitting device according to an exemplary embodiment of the present disclosure, since the first and second electrodes 110 and 120 are disposed on the same side thereof and a size thereof is small, it is possible to easily mount the light emitting device on an interconnection line of the substrate 10.

A light emitting apparatus according to an exemplary embodiment of the present disclosure emits light after turned on by applying a signal to the first electrode 110 and the second electrode 120. Emitted light may proceed in a lower direction through the first semiconductor layer 20 and the substrate 10, and light extraction efficiency in the lower direction is high by the protrusions 11 and the voids provided in the substrate 10.

In an exemplary embodiment of the present disclosure, for convenience of description, the protrusion is shown only in a conical shape, but the protrusion may be modified in various shapes within the limits without departing from the concepts of the present disclosure. For example, the shape of the protrusion may have a polygonal pyramid shape. In addition, even if provided in the conical shape, the shape of the curved surface forming the side surface may be partially modified. In addition, the cross-section of the protrusion may be close to a semi-elliptical sphere.

Figure 22:
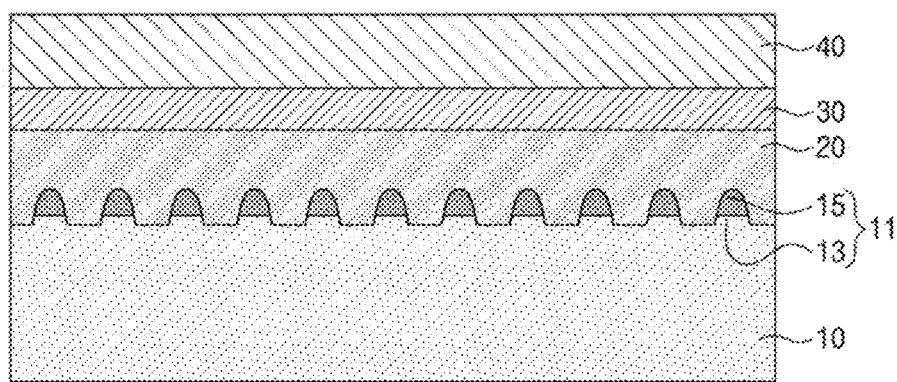
FIG. 22 is a schematic cross-sectional view illustrating a light emitting device according to an exemplary embodiment.

FIG. 22 is a schematic cross-sectional view illustrating a light emitting device according to an exemplary embodiment.

Referring to FIG. 22, the light emitting device according to an exemplary embodiment of the present disclosure includes a substrate 10 and a light emitting stack provided on the substrate 10.

In an exemplary embodiment of the present disclosure, the substrate 10 is patterned, and a pattern of a plurality of protrusions 11 is provided on an upper surface thereof. In other words, the protrusions 11 are provided in a form protruding in an upper direction from the upper surface of the substrate 10. In an exemplary embodiment, the protrusion 11 may be provided in a shape in which a width thereof decreases toward the upper direction, so that, when cutting the protrusion 11 with a plane perpendicular to the substrate 10, the cross-section of the protrusion 11 may be approximately a semi-elliptical sphere and may be a shape close to a triangular in a certain case.

The protrusion 11 includes a first layer 13 and a second layer 15 which are sequentially stacked from the upper surface of the substrate 10. The first layer 13 is provided on the substrate 10, and the second layer 15 is provided on the first layer 13.

The first semiconductor layer 20 may be provided on the substrate 10. The first semiconductor layer 20 may cover the protrusions 11 on the substrate 10. For this purpose, the first semiconductor layer 20 may be epitaxially grown from the upper surface of the substrate 10, and in this case, the first semiconductor layer 20 may be grown in the upper direction so as to completely cover side and upper surfaces of the protrusions 11.

In an exemplary embodiment of the present disclosure, a refractive index of the first semiconductor layer 20 may be greater than those of the first layer 13 and the second layer 15. For example, the refractive index of the first layer 13 may be about 1.6 to about 2.45, and that of the second layer 15 may be about 1.3 to about 2.0.

Figure 23:
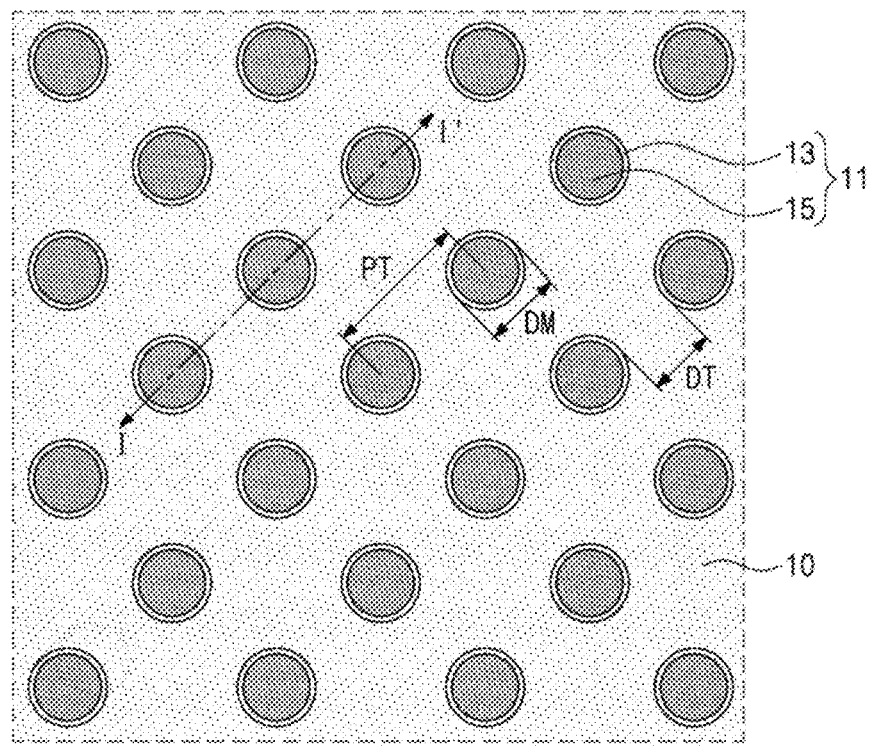
FIG. 23 is a plan view of a substrate with a protrusion pattern provided thereon among elements of the light emitting device of FIG. 22.
Figure 24:
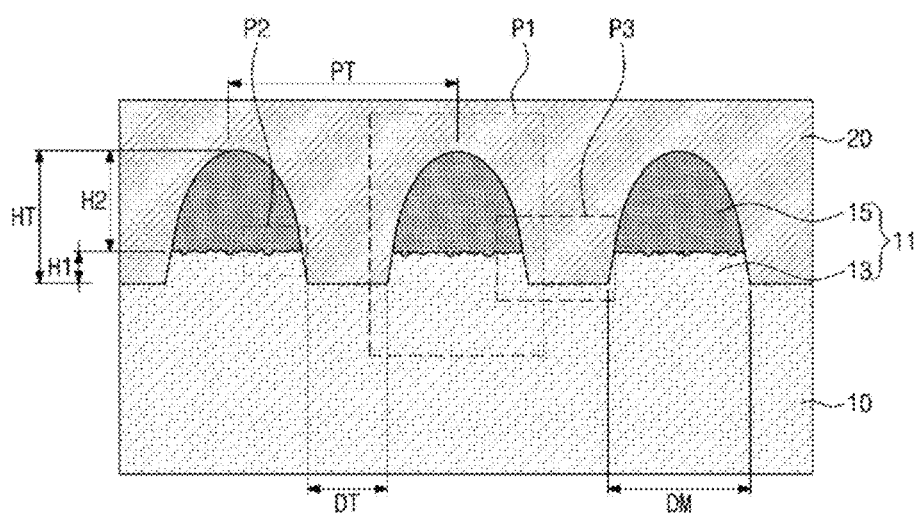
FIG. 24 is a cross-sectional view taken along line I-I' of FIG. 23.
Figure 25A:
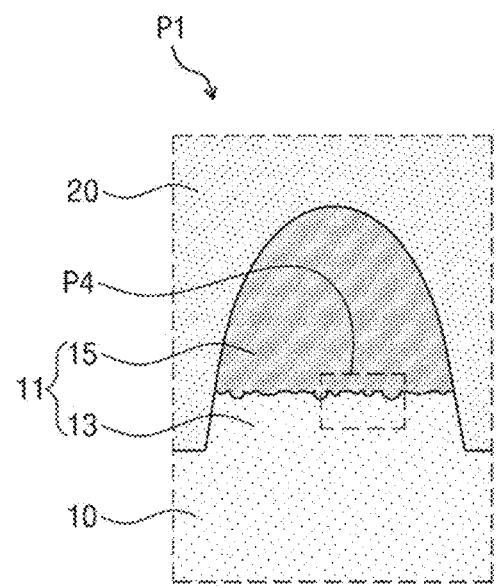
FIG. 25A is an enlarged cross-sectional view of P1 in FIG. 24.
Figure 25B:
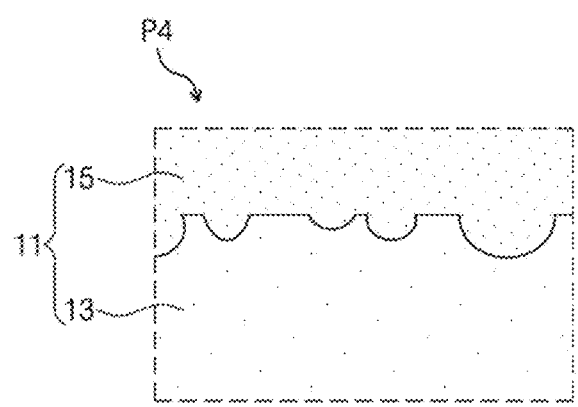
FIG. 25B is an enlarged cross-sectional view of P4 in FIG. 25A.

FIG. 23 is a plan view of a substrate with a protrusion pattern provided thereon among elements of the light emitting device of FIG. 22. FIG. 24 is a cross-sectional view taken along line I-I' of FIG. 23. FIG. 25A is an enlarged cross-sectional view of P1 in FIG. 24, and FIG. 25B is an enlarged cross-sectional view of P4 in FIG. 25A.

Referring to FIG. 23, FIG. 24, FIG. 25A, and FIG. 25B, protrusions 11 including a first layer 13 and a second layer 15 are provided on an upper surface of a substrate 10.

The first layer 13 is formed integrally with and inseparably from the substrate 10. As such, the first layer 13 includes the same material as that of the substrate 10. An upper surface of the first layer 13 may have a circular shape.

The second layer 15 is formed of a different material from that of the first layer 13. The material of the second layer 15 may be a material having a different refractive index from that of the material of the first layer 13, and in an exemplary embodiment of the present disclosure, the refractive index of the first layer 13 may be greater than that of the second layer 15. In this case, various insulating materials having different refractive indices may be used as the material of the first layer 13 and that of the second layer 15.

For example, as long as refractive indices stay within a certain limit, materials of different refractive indices are used for the first layer 13 and the second layer 15. For example, a material having a refractive index of about 1.6 to about 2.45 as the material of the first layer 13 may be used, and a material having a refractive index of about 1.3 to about 2.0 may be used as the material of the second layer 15. As the material having such a refractive index, the first layer 13 may include sapphire, and the second layer 15 may include $SiO_x$, $SiO_xN_y$, $SiN_x$, or the like, for example. In an exemplary embodiment, the first layer 13 may include sapphire, and the second layer 15 may include $SiO_2$. In this case, the refractive index of the first layer 13 is about 1.76, and the refractive index of the second layer 15 is about 1.46.

Each of the protrusions 11 may have a circular shape when viewed on a plane, as shown in FIG. 23. When the pattern of the protrusions 11 is provided in the conical shape or an elliptical sphere, a vertex portion of the conical shape or the elliptical sphere becomes a center.

The protrusion 11 may be provided in a size having a predetermined diameter DM and a height HT, as shown in FIG. 24. The diameter DM is referred to a width of a lowermost end of the protrusion 11 when viewed on a cross-section, and the height HT is referred to a distance from the upper surface of the substrate 10 to the vertex of the protrusion 11. In the exemplary embodiment, each of the protrusions 11 may have the same diameter DM and the same height HT from each other. However, each of the protrusions 11 may not have the exact same diameter DM and the exact same height HT, and the diameter DM and the height HT thereof may vary within a predetermined range.

In an exemplary embodiment of the present disclosure, a height H1 of the first layer 13 is formed to have a value greater than or equal to a predetermined value. When the height H1 of the first layer 13 is 0, growth of the first semiconductor layer 20 from the substrate 10 may be impeded by impurities remaining on the upper surface of the substrate 10 during a process. On the other hand, when a height H2 of the second layer 15 has a larger value than the height H1 of the first layer 13, the quality of the crystal may be improved by decreasing growth of crystals in a direction of the side surface of the first layer 13. Thus, the height of the second layer 15 may have a larger value than that of the first layer 13.

In an exemplary embodiment of the present disclosure, when the height H1 of the first layer 13 is between 0.2 μm and 0.6 μm from the surface of the substrate 10, for light proceeding from the first semiconductor layer 20 to the direction toward the substrate 10, a path of light proceeding to the inside of the substrate 10 increases. Accordingly, an absorption rate of light in the substrate 10 may increase, and thus, an amount of light passing through the substrate 10 may be reduced. In addition, in this case, since the height of the first layer 13 becomes relatively high, growth of crystals may occur in the direction of the side surface of the first layer 13 and the quality of the crystals may be reduced, which causes a decrease in light efficiency.

In an exemplary embodiment of the present disclosure, inclination degrees of side surfaces of the first layer 13 and the second layer 15 may be at least partially the same or different from each other. In FIG. 24, although the inclination degrees of the first layer 13 and the second layer 15 have the same value, the inventive concepts are not limited thereto, and the inclination degrees of the side surfaces of the first layer 13 and the second layer 15 may be at least partially the same or different from each other. In particular, the inclination degrees at a portion where the first layer 13 and the second layer 15 contact each other may be different from each other. Since the materials of the first layer 13 and the second layer 15 are different from each other, the inclination degrees of the side surfaces thereof may be set differently according to process conditions during an etching process. In the exemplary embodiment, the inclination degrees of the first layer 13 and the second layer 15 are formed differently, and thus, reflectance of light emitted from the light emitting device may be increased, thereby improving light emission efficiency.

In an exemplary embodiment of the present disclosure, an arrangement of the protrusions 11 may be regular as illustrated, but the inventive concepts are not limited thereto. For example, the protrusions 11 may be arranged irregularly. Even in this case, when viewed on the substrate 10, a pitch PT and a distance DT of the protrusions 11 per single area are within a predetermined range, and, in this case, a density thereof may be provided at substantially the same level.

In an exemplary embodiment of the present disclosure, for convenience of description, only the protrusion 11 is shown to have a conical shape, but the protrusion 11 may be modified in various forms within the limits without departing from the concepts of the present disclosure. For example, the shape of the protrusion 11 may have a polygonal pyramid shape. In addition, even when provided in the conical shape, a shape of the curved surface forming the side surface may be partially modified.

In an exemplary embodiment of the present disclosure, the pitch PT of the pattern of the protrusions 11 may have a value within a predetermined range according to the diameter DM. For example, a ratio of the diameter DM of the protrusion 11 to the pitch PT thereof may be in a range of about 0.3 to about 2.0. However, the ratio of the diameter DM of the protrusion 11 to the pitch PT thereof is not limited thereto, and may be provided in other numerical values.

In an exemplary embodiment of the present disclosure, an interface between the first layer 13 and the second layer 15, is formed to be substantially parallel to the substrate surface, that is, the upper surface of the substrate 10, and the surface thereof has roughness.

When viewed with reference to the first layer 13, the first layer 13 may have approximately a truncated cone shape with a flat upper surface thereof. Accordingly, the first layer 13 may have the upper surface substantially parallel to the substrate surface, and a side surface connecting the substrate surface and the upper surface. The upper surface of the first layer 13 has a roughened surface (i.e., projections and depressions) so that light incident from the first semiconductor layer 20 in a direction of the substrate 10 (the lower direction in the drawing) can enter the substrate 10 as much as possible. In other words, the upper surface of the first layer has projections and depressions provided with a convex portion protruding in the upper direction of the substrate surface and a concave portion recessed in the lower direction of the substrate surface. When the upper surface of the first layer 13, that is, the flat surface without the projections and depressions on the interface between the second layer 15 and the first layer 13, reflectance of light is higher than that of the surface with the projections and depressions, and thus, an amount of light proceeding in the lower direction of the substrate 10 is reduced. When projections and depressions are formed on the upper surface of the first layer 13, light is scattered or refracted rather than reflected at the portions where the projections and depressions are formed, and thus, light proceeds easily into the substrate 10. Light incident into the first substrate 10 passes through the substrate 10 and is emitted to a rear surface of the substrate 10.

Figure 26A:
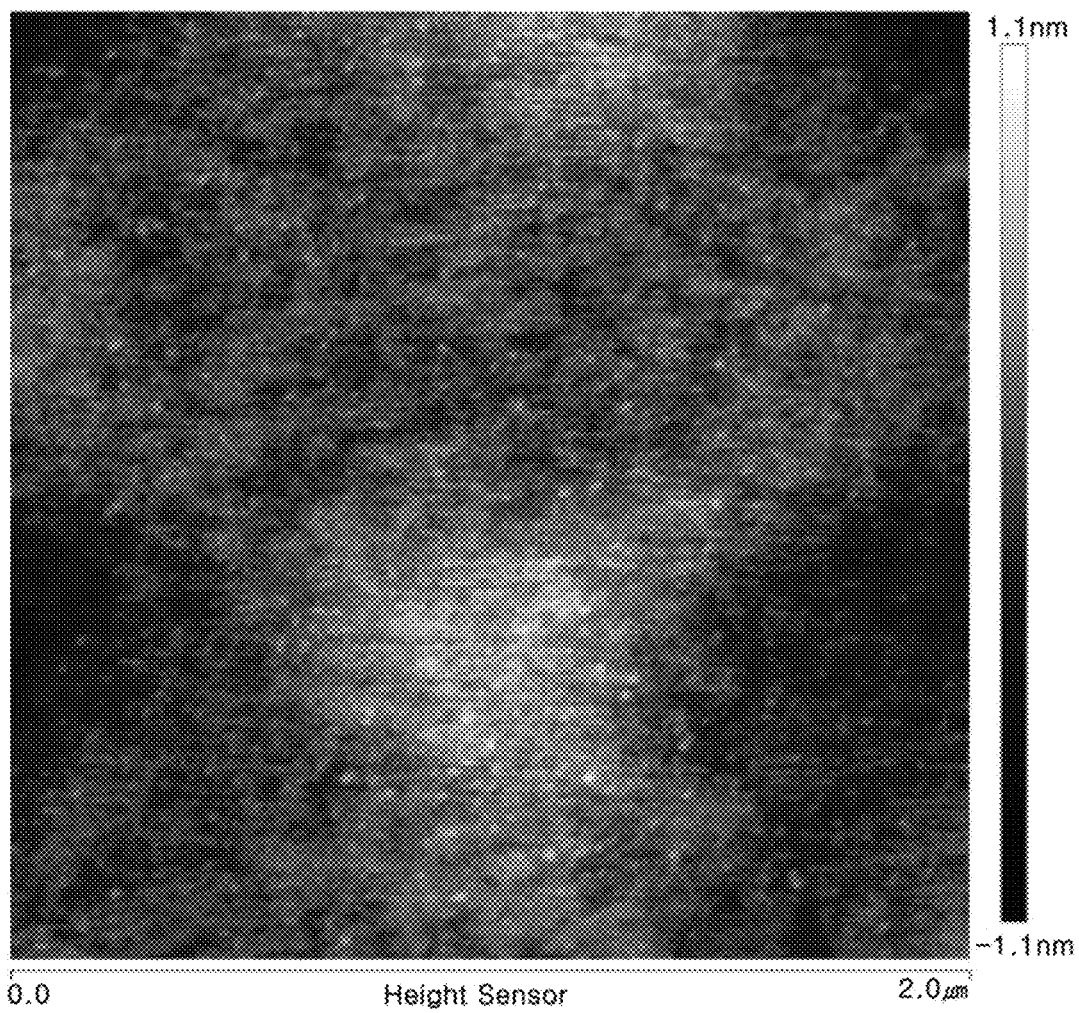
FIG. 26A shows a photograph of an upper surface of a first layer of a light emitting device according to the prior art.
Figure 26B:
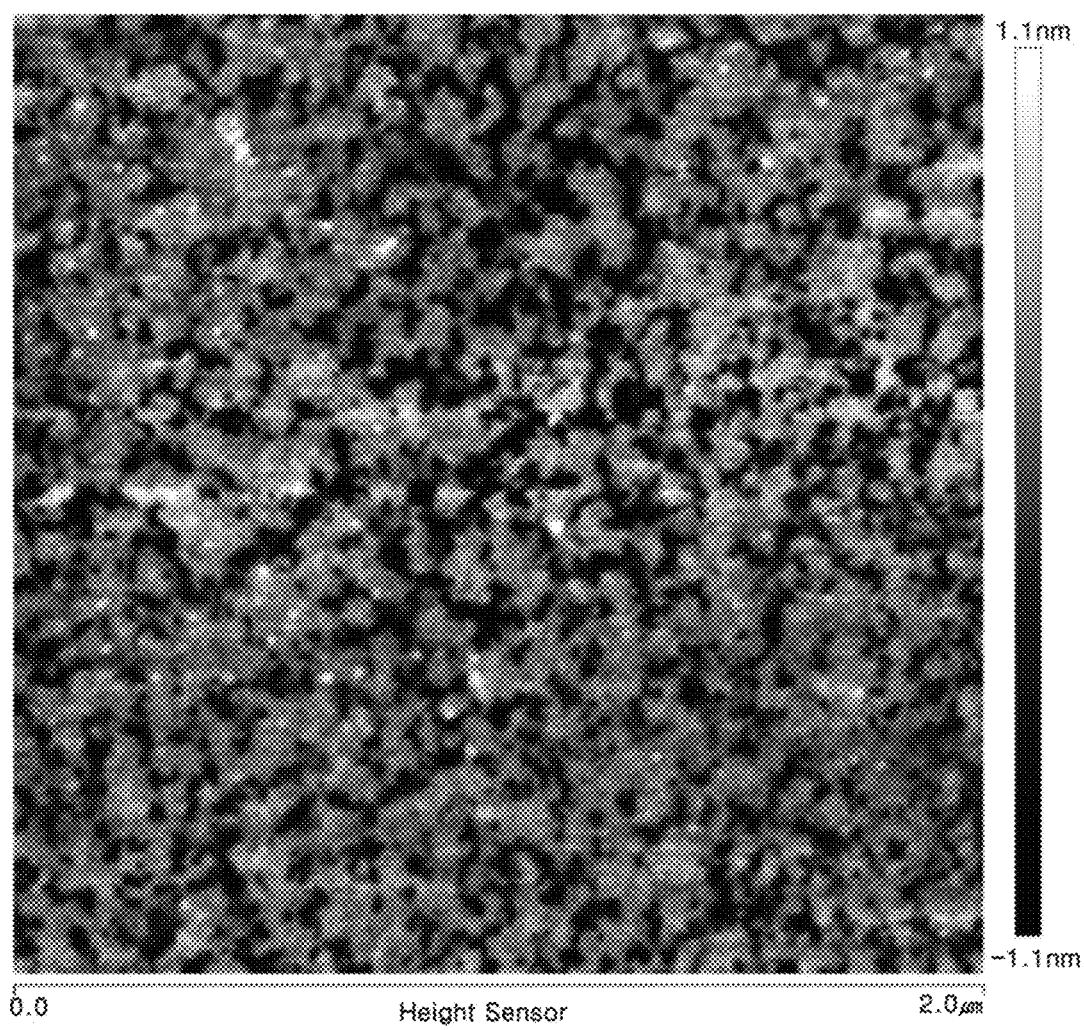
FIG. 26B shows a photograph of an upper surface of a first layer of a light emitting device according to an exemplary embodiment of the present disclosure.

The projections and depressions between the first layer 13 and the second layer 15 is illustrated in FIG. 25A and FIG. 25B. In addition, FIG. 26A shows a photograph of an upper surface of a first layer of a light emitting device according to the related art and FIG. 26B shows a photograph of a light emitting device according to an exemplary embodiment of the present disclosure, respectively. In FIG. 26A and FIG. 26B, each photograph is an Atomic Force Microscope (AFM) photograph, and specimens corresponding to the upper surfaces of the first layers are manufactured in 2 μm width and 2 μm length, respectively.

As shown in FIG. 26A, in the case of the prior art, projections and depressions are not provided on the upper surface of the first layer and are provided flat. For the roughness of the prior art, a standard deviation of roughness Rq may be 0.200 nm to 0.300 nm, an arithmetic mean of roughness Ra may be 0.140 nm to 0.190 nm, for example, Rq may be 0.216 nm, Ra may be 0.169 nm.

In the case of an exemplary embodiment of the present disclosure, as shown in FIG. 26B, the roughened surface, that is, projections and depressions, is provided on the upper surface of the first layer. Herein, the roughness may be provided in various degrees, but for the roughness according to an exemplary embodiment, a standard deviation of roughness Rq may be about 0.300 nm to about 0.550 nm, and an arithmetic mean of roughness Ra may be about 0.250 nm to about 0.400 nm, for example, the standard deviation Rq may be 0.447 nm and the arithmetic mean Ra may be 0.327 nm.

As described above, in the light emitting devices according to an exemplary embodiment of the present disclosure, the protrusion pattern is provided on the substrate, and light extraction efficiency is significantly increased when light in a specific direction is transmitted by the protrusion pattern. In particular, light generated in the active layer proceeds in the direction passing through the substrate and the first semiconductor layer, and when light passes through the substrate, light diffusion and light scattering due to the protrusion pattern occur, and thus, the light extraction effect in the rear direction of the substrate is significantly elevated. As light diffusion and light scattering by the protrusion pattern are mainly increased by the roughened surface provided on the interface between the first layer and the second layer, the amount of light proceeding in the lower direction is increased. In addition, in the case of the present disclosure, the interface between the first layer and the second layer is provided with irregular projections and depressions, thereby reducing reflection of light passing through the first and second layers to a minimum. Particularly, in an exemplary embodiment of the present disclosure, since the refractive indices of the first layer, the second layer, and the first semiconductor layer are formed differently, and the refractive indices decrease in the order of the first semiconductor layer, the first layer, and the second layer, refraction or reflection of light passing through the first semiconductor layer, the first layer, and the second layer may maximize light emission in the lower direction.

In the exemplary embodiment, in the first layer, a roughened surface is not substantially provided on side surfaces except the upper surface. The side surface may be provided as a reflection surface on which substantially less light passes through the side surface. In the exemplary embodiment, the side surface may be the reflection surface that reflects 80% or more, for example, 90% or more, preferably 95% or more of light proceeding from the first semiconductor layer to the side surface of the first layer, which will be described later. In an exemplary embodiment of the present disclosure, a roughened surface may not be provided in a region of the substrate surface where the protrusions are not provided.

Figure 27A:
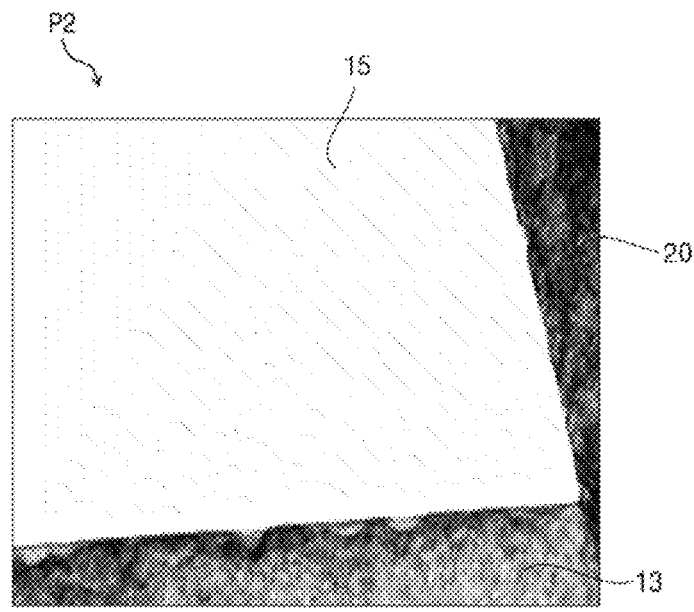
FIG. 27A is a Transmission Electron Microscope (TEM) photograph of a portion corresponding to portion P2 of FIG. 24, when manufacturing a light emitting device according to an exemplary embodiment.
Figure 27B:
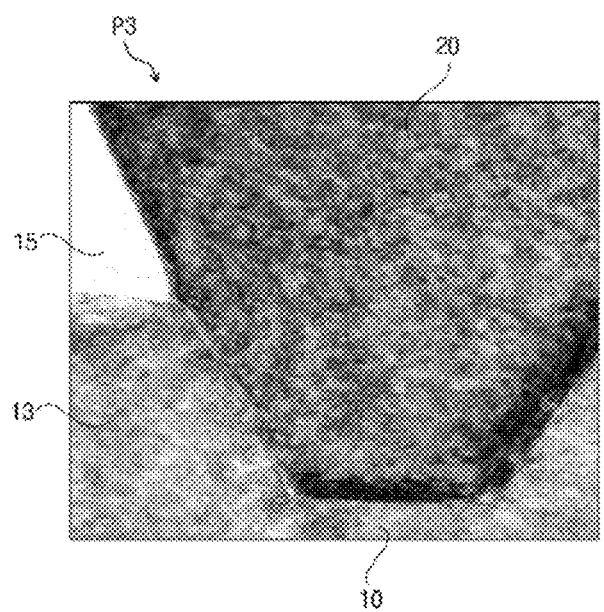
FIG. 27B is a Transmission Electron Microscope (TEM) photograph of a portion corresponding to a portion P3 of FIG. 24, when manufacturing a light emitting device according to an exemplary embodiment.

FIG. 27A and FIG. 27B are transmission electron microscope (TEM) photographs of portions corresponding to portions P2 and P3 of FIG. 24, respectively, when manufacturing a light emitting device according to an exemplary embodiment.

Referring to FIG. 27A, a portion indicated in white is the second layer 15, and a portion disposed under the second layer 15 corresponds to the first layer 13. As illustrated, projections and depressions may be irregularly formed on the upper surface of the first layer 13.

Referring to FIG. 27B, a roughened surface is not substantially provided on the side surface except the upper surface of the first layer 13, and the first layer 13 is provided as a substantially flat surface without projections and depressions.

In addition, the substrate surface, that is, the upper surface of the substrate 10 may also be provided as a substantially flat surface without projections and depressions.

However, in an exemplary embodiment of the present disclosure, in a case of the upper surface of the substrate 10, it may be provided as a flat surface on which projections and depressions is not formed, but the present concepts are not limited thereto, and projections and depressions may be formed on the upper surface of the substrate as the upper surface of the first layer 13 to improve an incident rate of light in the lower direction. That is, a roughened surface may be provided on the substrate surface where the protrusions are not provided, and a diffusion rate or scattering rate of light proceeding in the lower direction through a portion where the protrusions are not provided may increase. As a result, the light extraction effect in the light emitting device may be increased.

Figure 28A:
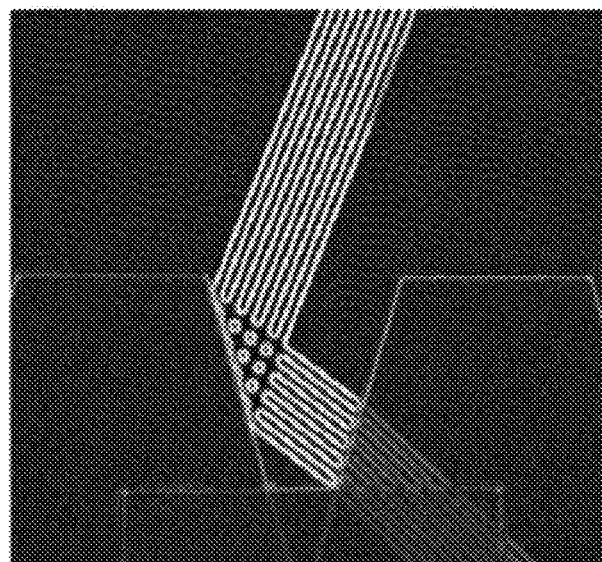
FIG. 28A is a PhET simulation photograph showing a path of light depending on one shape of a side surface of a first layer.
Figure 28B:
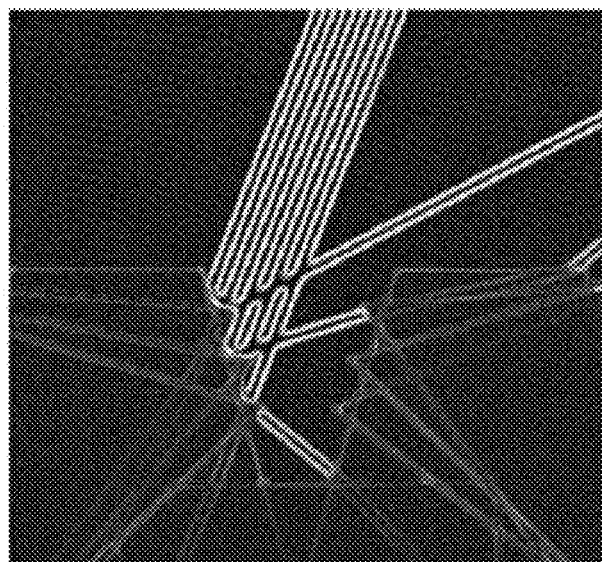
FIG. 28B is a PhET simulation photograph showing a path of light depending on another shape of the side surface of the first layer.

FIG. 28A and FIG. 28B are PhET simulation photographs showing a path of light depending on shapes of a side surface of a first layer. In FIG. 28A and FIG. 28B, for a structure in which a first semiconductor layer was grown after forming a first layer on a substrate, a direction of progress of light was shown, and all conditions were set the same except for the shapes of the side surface of the first layer. In FIG. 28A, projections and depressions were set to be formed on the side surface of the first layer, and in FIG. 28B, a flat reflection surface without projections and depressions was set to be formed on the side surface of the first layer.

Referring to FIG. 28A, when light proceeds from the first semiconductor layer to the side surface of the first layer, light is scattered and reflected in various directions due to projections and depressions formed on the side surface of the first layer. Since light extraction efficiency of the light emitting device is determined by how much light proceeds from an active layer to a rear surface of the substrate through the first semiconductor layer and the substrate, when light is reflected or scattered radially as shown in FIG. 28A, a problem occurs in that light efficiency in a lower direction is significantly reduced.

On the contrary, referring to FIG. 28B, when light proceeds from the first semiconductor layer to the side surface of the first layer, in a case that the side surface of the first layer acts as the reflection surface, since the reflection surface is flat, it can be seen that most light is reflected from the side of the first layer in a specific direction, but reflected light is incident on the substrate, and light proceeding in the lower direction is significantly increased.

As described above, the light extraction efficiency of the light emitting device having the protrusion pattern, in particular, the protrusion pattern having a roughened surface on the upper surface of the first layer and having the side surface includes the reflection surface, is significantly increased compared to that of the prior art.

The protrusion pattern having the above-described structure may be manufactured as follows.

FIGS. 29A through 29G are cross-sectional views sequentially illustrating a method of manufacturing a protrusion pattern in a light emitting device according to an exemplary embodiment.

Figure 29A:
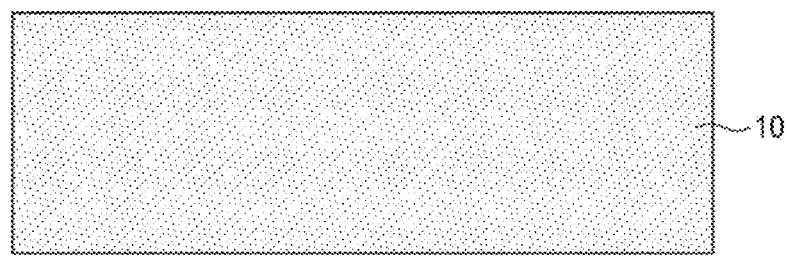
FIG. 29A is a cross-sectional view sequentially illustrating a method of manufacturing a protrusion pattern in a light emitting device according to an exemplary embodiment, specifically preparing a substrate.

First, referring to FIG. 29A, a substrate 10 is prepared. As described above, the substrate 10 may include a material, such as SiC, Si, GaAs, GaN, ZnO, GaP, InP, Ge, $Ga_2O_3$, or the like, and an insulation layer may include $SiO_x$, $SiO_xN_y$, $SiN_x$ or the like.

Figure 29B:
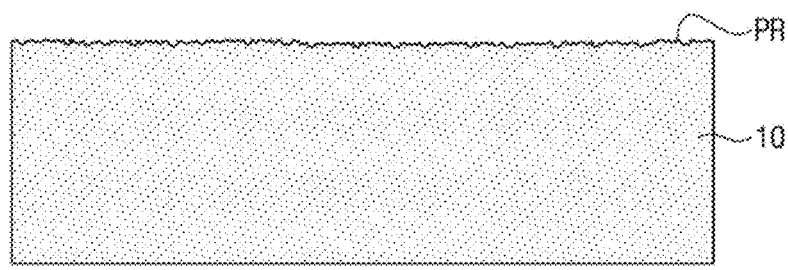
FIG. 29B illustrates forming a roughened surface on the upper surface of the substrate formed as shown in FIG. 29A.

Referring to FIG. 29B, a roughened surface, that is, projections and depressions PR, is formed on an upper surface of the substrate 10. The projections and depressions PR may be formed by various methods such as wet etching, dry etching, grinding, or a combination of these methods, but the inventive concepts are not limited thereto.

Figure 29C:
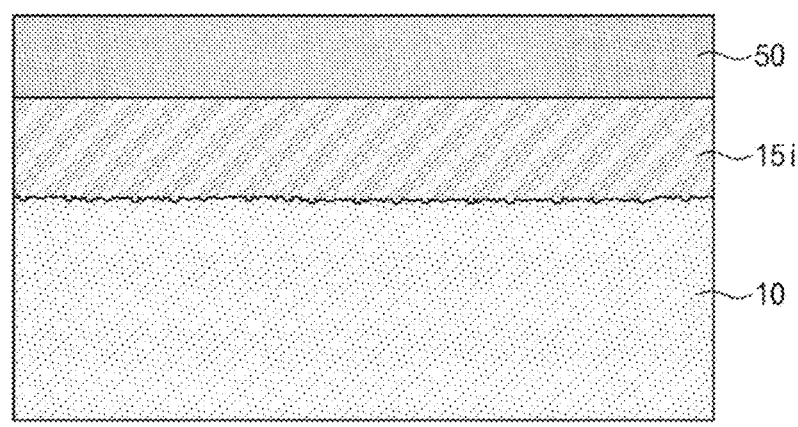
FIG. 29C illustrates applying a photoresist over the roughened surface as shown in FIG. 29B.

Referring to FIG. 29C, an insulation layer 15i is stacked using a material for forming a second layer on the substrate 10. The insulation layer 15i may be formed of a material capable of forming the second layer on the substrate 10, and may be formed of a material having a refractive index different from that of the substrate 10.

Figure 29D:
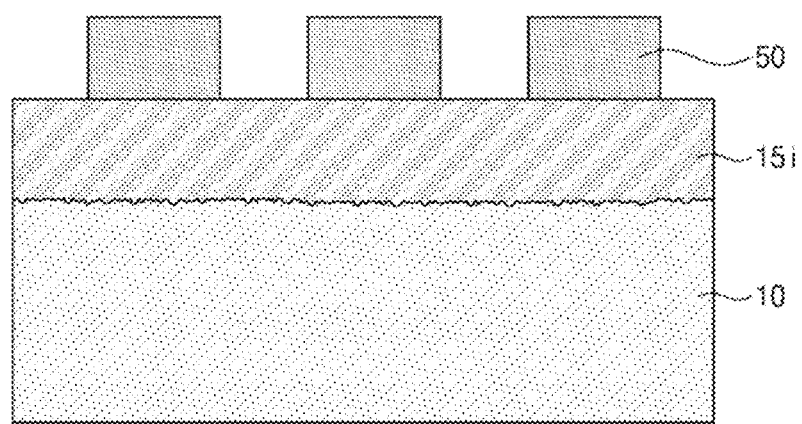
FIG. 29D illustrates performing photolithography including exposure and development subsequent to FIG. 29C.

Referring to FIG. 29D, next, a pattern of a photoresist 50 is formed by applying the photoresist 50 on the insulation layer 15i and performing photolithography including exposure and development.

Figure 29E:
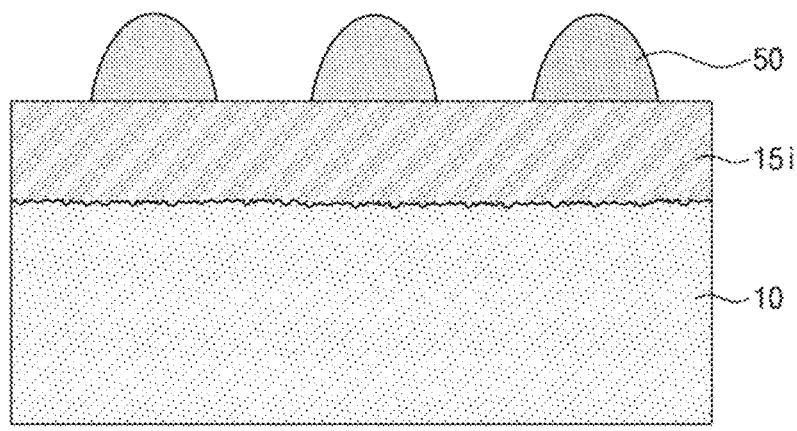
FIG. 29E illustrates reflowing the photoresist pattern as shown in FIG. 29D.

Referring to FIG. 29E, the pattern of the photoresist 50 is reflowed. Through reflowing the photoresist 50, a thickness of the photoresist 50 may vary depending on a region, and accordingly, etching shapes of the insulation layer 15i and the substrate 10 thereunder may be changed thereafter.

Figure 29F:
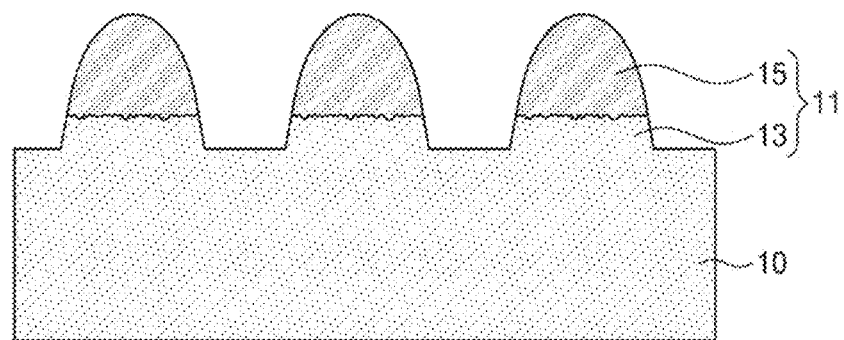
FIG. 29F illustrates forming the protrusions having the first layer and the second layer.

Referring to FIG. 29E and FIG. 29F, the protrusion 11 having the first layer 13 and the second layer 15 by etching the insulation layer 15i and the substrate 10 using the photoresist 50 as a mask is formed. Portions of the insulation layer 15*i* and the substrate 10 are etched using the photoresist pattern as a mask, and the second layer 15 is formed by etching the insulation layer 15*i* except for a portion where the protrusions 11 are to be formed. In a portion where the second layer 15 is not formed, the upper surface of the substrate 10 is exposed. Herein, the first layer 13 is formed by overetching the upper surface of the substrate 10 more than the upper surface of the original substrate 10 through additional etching. If only the second layer 15 is formed and etching is performed such that the original upper surface of the substrate 10 is exposed, theoretically, it can be predicted that growth of the semiconductor layer can easily occur after the upper surface of the substrate 10 is exposed, but, in practice, growth of a first semiconductor layer 20 does not properly occur thereafter due to etching residues or impurities present on the upper surface of the substrate 10. As such, additional etching is performed to completely remove etching residues, impurities, or the like on the substrate 10. Thus, the first layer 13 is formed.

Etching to form the first layer 13 and the second layer 15 may be performed under various conditions using various methods depending on materials. For example, portions of the insulation layer and the substrate 10 may be patterned using dry etching.

In the above-described method, the second layer 15 and the first layer 13 may be sequentially formed, and may be patterned using the same or different etching gases.

The insulation layer 15*i* and the substrate 10 may be performed by anisotropy where etching in the vertical direction may be performed, but etching in the left and right directions may not be relatively performed.

Figure 29G:
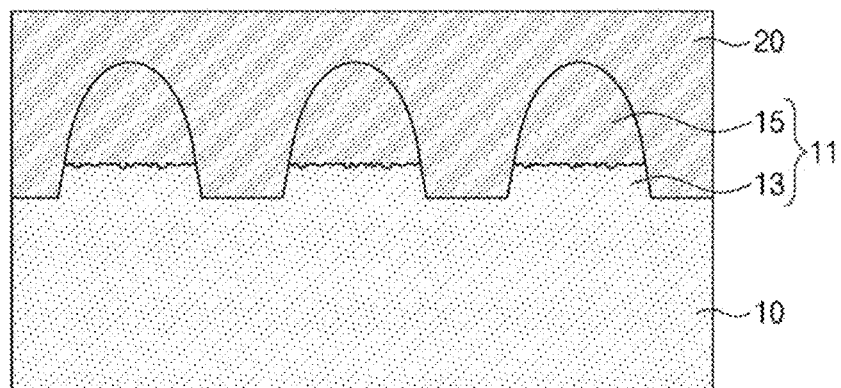
FIG. 29G illustrates forming a light emitting stack including the protrusions formed in FIG. 29F.

Referring to FIG. 29G, the light emitting device may be formed by sequentially forming a light emitting stack including the first semiconductor layer 20 on the substrate on which the protrusions 11 are formed. First, the first semiconductor layer 20 is formed on the substrate 10 on which the protrusions 11 are formed. The first semiconductor layer 20 is first grown in an upper direction from the exposed surface of the substrate 10, and then grown in the upper direction and a direction of a side surface. After the first semiconductor layer 20 is grown, the active layer 30 (see FIG. 22) and the second semiconductor layer 40 (see FIG. 22) may be sequentially formed on the first semiconductor layer 20.

In more detail, first, the first semiconductor layer 20 is formed in the upper direction. The first semiconductor layer 20 may be formed of a semiconductor layer of various materials, for example, an n-type nitride-based semiconductor layer, and may be formed using an organic metal vapor phase epitaxy or molecular beam epitaxy (MBE) or hydride vapor phase epitaxy (HVPE) method.

An initial growth of the first semiconductor layer 20 is 3D growth (e.g., Volmer-Weber growth) mainly occurring in the upper direction from the exposed surface of the substrate 10, and the growth does not occur on an upper surface of the second layer 15. After the first semiconductor layer 20 is partially grown in the upper direction, the first semiconductor layer 20 is grown in the upper direction and the direction of the side surface. In an exemplary embodiment, for the growth in the direction of the side surface (horizontal direction in the drawing) of the first semiconductor layer 20, epitaxial lateral over-growth (ELOG) may be used as a metal-organic chemical vapor deposition (MOCVD) method.

The first semiconductor layer 20 is merged to cover an entire surface of the substrate 10 including the surface of the second layer 15 by continuously growing in the direction of the side surface and the upper direction. The first semiconductor layer 20 undergoes a process of merging into one crystal while growing in an upper direction from the substrate surface and/or the direction of the side surface.

After entirely forming the first semiconductor layer 20 through growing in the side direction, selectively, the first semiconductor layer 20 may be further grown in the upper direction using HVPE. When forming the first semiconductor layer 20 by using MOCVD, since a deposition rate thereof is slower than that of HVPE, HVPE may be used when the first semiconductor layer 20 is to be grown quickly to have a sufficient thickness.

The first semiconductor layer 20 formed as described above covers the surface of the substrate 10 and the protrusions 11 in a state in which voids are formed.

In an exemplary embodiment of the present disclosure, a buffer layer may be further formed on the substrate 10 before forming the first semiconductor layer 20. In an exemplary embodiment, a superlattice structure may be formed by alternately stacking two types of layers having different band gaps on the first semiconductor layer 20. The active layer 30 is formed on the first semiconductor layer 20. In an exemplary embodiment, a quantum well structure may be formed by alternately stacking a quantum well layer and a barrier layer as the active layer 30. An electron blocking layer may be formed on the active layer 30, and then, a second semiconductor layer 40 may be formed on the active layer 30, and thus, a light emitting stack may be manufactured.

As described above, by forming the projections and depressions on the upper surface of the first layer, an amount of light proceeding in the lower direction may be significantly increased, and as a result, it is possible to manufacture the light emitting device having high light efficiency.

The light emitting device having the above-described structure may be implemented in various types of semiconductor chips.

Figure 30:
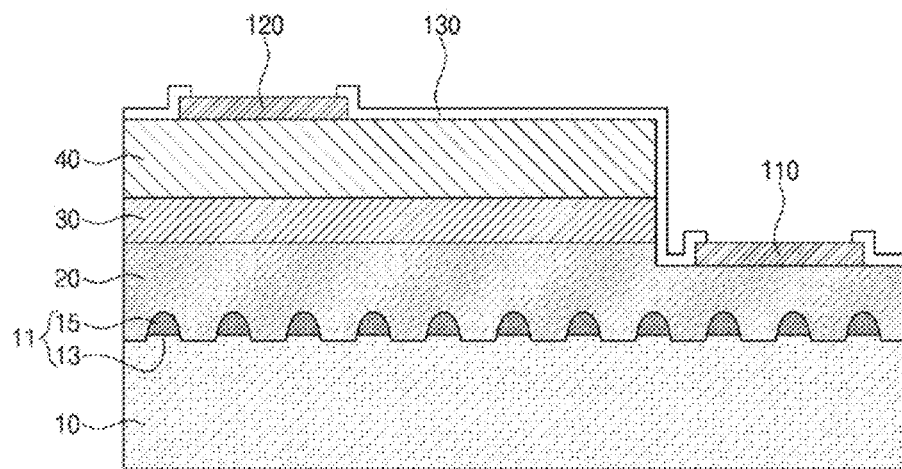
FIG. 30 is a cross-sectional view illustrating a semiconductor chip according to an exemplary embodiment, showing a lateral type semiconductor chip.

FIG. 30 is a cross-sectional view illustrating a semiconductor chip according to an exemplary embodiment, showing a lateral type semiconductor chip.

Referring to FIG. 30, the semiconductor chip includes a light emitting device and first and second electrodes 110 and 120 connected to the light emitting device. The light emitting device includes a substrate 10, a first semiconductor layer 20 provided on the substrate 10, an active layer 30, and a second semiconductor layer 40.

In the exemplary embodiment, the first electrode 110 is disposed on the first semiconductor layer 20 where the active layer 30 and the second semiconductor layer 40 are not provided, and the second electrode 120 is disposed on the second semiconductor layer 40.

The first and/or second electrodes 110 and 120 may include a single layer or multi-layer metal. Materials of the first and/or second electrodes 110 and 120 may include Al, Ti, Cr, Ni, Au, Ag, Cr, Cu, Ti, Ru, Rh, Ir, Mg, Zn, Al, In, Ta, Pd, Co, and various metals and alloys thereof.

Herein, a plurality of protrusions 11 is provided on an upper surface of the substrate 10 to increase light emission efficiency. The protrusions 11, as described in the above-described exemplary embodiment, may be provided on the substrate 10 in a conical shape including the first layer 13 and the second layer 15, and voids are provided near an interface between the first and second layers.

An insulation film 130 is provided on the first and second electrodes 110 and 120, and contact holes exposing the first electrode 110 and the second electrode 120 are provided on the insulation film 130. The insulation film 130 may be disposed on an upper surface of the second semiconductor layer 40 and side surfaces of the semiconductor layers, and may selectively contact the first and second electrodes 110 and 120. The insulation film 130 may include an insulating material or an insulating resin formed of at least one of oxide, nitride, fluoride, and sulfide having at least one of Al, Cr, Si, Ti, Zn, and Zr. The insulation film 130 may be selectively formed of, for example, $SiO_2$, $Si_3N_4$, $Al_2O_3$, and $TiO_2$. The insulation film 130 may be formed of a single layer or multiple layers, but the inventive concepts are not limited thereto.

In an exemplary embodiment of the present disclosure, the first electrode 110 and the second electrode 120 may be connected to other elements through the contact holes. For example, the first and second electrodes 110 and 120 may be provided with first and second pads connected through the contact holes. In addition, in an exemplary embodiment of the present disclosure, the light emitting device is simply described with reference to the drawings, but the light emitting device may further include an element having an additional function in addition to the above-described layers. For example, various layers may be further included, such as a reflective layer that reflects light, an additional insulation layer to insulate specific elements, and an anti-solder layer that prevents diffusion of solder.

In addition, in forming a lateral type light emitting device, mesas may be formed in various forms, and a location and a shape of the first and second electrodes 110 and 120 may also be variously modified.

A light emitting apparatus according to an exemplary embodiment of the present disclosure emits light after turned on by applying a signal to the first electrode 110 and the second electrode 120. Emitted light may proceed in a lower direction through the first semiconductor layer 20 and the substrate 10, and light extraction efficiency in the lower direction is high by the protrusions 11 and the voids provided in the substrate 10.

Although the semiconductor chip including the light emitting device according to the above-described exemplary embodiment is illustrated as a lateral type, the inventive concepts are not limited thereto. For example, the light emitting device according to an exemplary embodiment may be applied to a vertical type or flip-chip type semiconductor chip.

Figure 31:
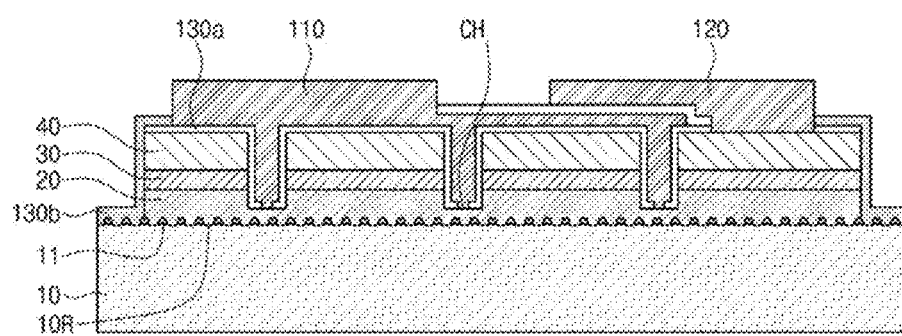
FIG. 31 is a cross-sectional view illustrating a semiconductor chip according to an exemplary embodiment, showing a flip-chip type semiconductor chip.

FIG. 31 is a cross-sectional view illustrating a semiconductor chip according to an exemplary embodiment, showing a flip-chip type semiconductor chip. Since the flip-chip type semiconductor is formed on a substrate and then inverted and mounted on other elements, the flip-chip type semiconductor is shown in an inverted form in the drawing.

Referring to FIG. 31, the light emitting device includes a substrate 10, a light emitting stack provided on an upper surface 10R of the substrate 10, and first and second electrodes 110 and 120 connected to the light emitting stack.

In an exemplary embodiment of the present disclosure, the substrate 10 is patterned, and a plurality of protrusions and voids are provided on the upper surface thereof.

The light emitting stack includes a first semiconductor layer 20, an active layer 30, and a second semiconductor layer 40 which are sequentially stacked on the upper surface 10R of the substrate 10. In the exemplary embodiment, the light emitting stack may be provided in at least one mesa form including the active layer 30 and the second semiconductor layer 40. When the light emitting stack is provided in a form of a mesa, the light emitting stack may include the plurality of protrusions, and the plurality of protrusions may be spaced apart from one another.

An insulation film 130a is provided on the light emitting stack. At least one contact hole CH passing through the active layer 30, the second semiconductor layer 40, and the insulation film 130a to expose a portion of the first semiconductor layer 20 is provided in the light emitting stack. The first electrode 110 is connected to the first semiconductor layer 20 exposed through the contact hole CH. The second electrode 120 is connected to the second semiconductor layer 40 exposed through an opening formed in the insulation film 130a. An additional insulation film 130b may be further provided on a side of the light emitting stack. The additional insulation film 130b may be formed of various types of mirrors (for example, metal mirrors or dielectric mirrors) so that light emitted from the active layer 30 does not emit in a direction of the side of the light emitting stack.

In the light emitting device according to an exemplary embodiment of the present disclosure, since the first and second electrodes 110 and 120 are disposed on the same side thereof and a size thereof is small, it is possible to easily mount the light emitting device on an interconnection line of the substrate 10.

A light emitting apparatus according to an exemplary embodiment of the present disclosure emits light after turned on by applying a signal to the first electrode 110 and the second electrode 120. Emitted light may proceed in a lower direction through the first semiconductor layer 20 and the substrate 10, and light extraction efficiency in the lower direction is high by the protrusions 11 and the voids provided in the substrate 10.

Since the light emitting device having the above-described structure has a high light extraction efficiency, an experiment was performed to compare luminous efficiency of the light emitting device according to an exemplary embodiment of the present disclosure with that of the prior art.

In the following experiment, first, Comparative Examples 5 and 6 are light emitting devices which used a substrate formed with protrusions including only a first layer and having total heights of 1.7 μm and 2.1 μm, respectively, and Comparative Example 7 is a light emitting device which used a substrate formed with protrusions including a first layer and a second layer. The light extraction efficiency for the Comparative Examples 5 to 7 were checked. In the experiment, the substrate and the first layer were formed of sapphire, and the second layer was formed of $SiO_2$. All elements except for the protrusion pattern were the same in Comparative Examples 5 through 7. In Comparative Example 7, a height of the first layer was 0.4 μm, and a height of the second layer was 1.7 μm.

Table 12 shows the luminous efficiency of Comparative Example 5 through Comparative Example 7.

TABLE 12

| Substrate | Intensities of Light (arbitrary unit) | | | Luminous Efficiency |
|---|---|---|---|---|
| | Upper Direction | Side Direction | Total Sum | Improvement (%) |
| Comparative Example 5 (HT: 1.7 μm) | $7.73 \times 10^{-09}$ | $3.41 \times 10^{-09}$ | $1.1135 \times 10^{-08}$ | 0.0 |
| Comparative Example 6 (HT: 2.1 μm) | $7.91 \times 10^{-09}$ | $3.47 \times 10^{-09}$ | $1.14 \times 10^{-08}$ | 2.2 |

TABLE 12-continued

| | Intensities of Light (arbitrary unit) | | | Luminous Efficiency |
|---|---|---|---|---|
| Substrate | Upper Direction | Side Direction | Total Sum | Improvement (%) |
| Comparative Example 7 (HT: 2.1 μm) | $8.36 \times 10^{-09}$ | $3.41 \times 10^{-09}$ | $1.1765 \times 10^{-08}$ | 5.7 |

Referring to Table 12, when looking at Comparative Example 5 and Comparative Example 6 in which the protrusions were formed with only the first layer, in Comparative Example 6 which has a higher height of the protrusion than that of Comparative Example 5, the luminous efficiency thereof was improved by 2.2% compared to that of Comparative Example 5. When the height of the protrusion was fixed at 2.1 μm, the light emission efficiency of Comparative Example 7 formed of the first layer and the second layer was significantly higher than that of Comparative Example 6 formed of only the first layer, the luminous efficiency of Comparative Example 6 was improved by 2.2% compared to that of Comparative Example 5, and the luminous efficiency of Comparative Example 7 was significantly improved by 5.7% compared to that of Comparative Example 1. As described above, it was confirmed that when the protrusions are formed of the first layer and the second layer, the luminous efficiency becomes significantly higher than that of other cases.

Figure 32:
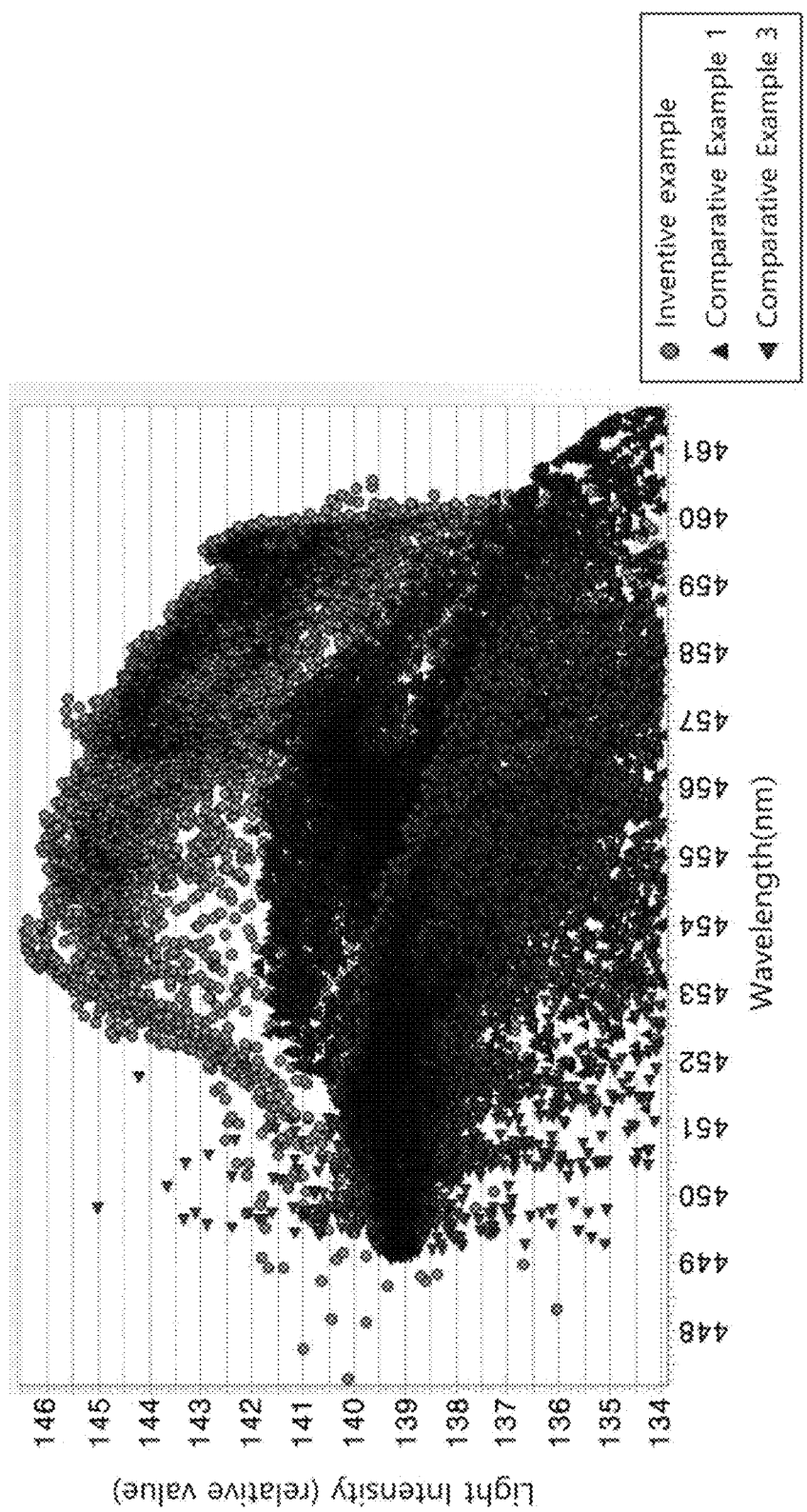
FIG. 32 is a graph showing intensities of emitted light depending on wavelengths of light emitting devices according to Comparative Example 1, Comparative Example 3, and Inventive Example.

Next, the light emitting device with the protrusion pattern having roughened surface formed on an interface between the first layer and the second layer was used as Inventive Example, and the luminous efficiency of Inventive Example was measured together with those of Comparative Example 5 and Comparative Example 7. FIG. 32 is a graph showing intensities of emitted light depending on wavelengths of light emitting devices according to Comparative Example 5, Comparative Example 7, and Inventive Example. In FIG. 32, the light emitting device of the Inventive Example was manufactured under the same conditions as those of Comparative Example 7 except for the protrusions. In a case of the protrusions of Inventive Example, projections and depressions was formed on the interface between the first layer and the second layer, unlike the Comparative Example 7.

Referring to FIG. 32, it can be seen that the luminous efficiency of Comparative Example 7 is higher than that of Comparative Example 5, which is substantially the same as the results in Table 12 above. In addition, referring to FIG. 30, compared to Comparative Example 7, the luminous efficiency of Inventive Example was considerably high in most wavelength bands, in particular, in a range of about 450 nm to about 460 nm. In Comparative Example 7 and Inventive Example, since all other portions are formed identically except for the projections and depressions on the upper surface of the first layer of Inventive Example, a difference in luminous efficiency was interpreted to be due to the projections and depressions on the upper surface of the first layer.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

Accordingly, the technical scope of the present disclosure should not be limited to the contents described in the detailed description of the specification, but should be defined by the claims.

What is claimed is:

1. A light emitting device, comprising:
    a substrate;
    a pattern of a plurality of protrusions protruding from the substrate in a first direction, the plurality of protrusions arranged side by side in a second direction being perpendicular to the first direction;
    a first semiconductor layer provided on the substrate;
    an active layer provided on the first semiconductor layer; and
    a second semiconductor layer provided on the active layer, wherein:
    each of the protrusions includes:
        a first layer integrally formed with the substrate and protruding from an upper surface of the substrate in the first direction; and
        a second layer provided on the first layer and formed of a material different from that of the first layer, wherein a distance between centers of two adjacent protrusions in the second direction corresponds to a pitch, and a ratio of a diameter of the protrusion to the pitch of the protrusion pattern is about 0.8 to about 1.0;
    voids aligned with a side of the plurality of protrusions in the second direction, wherein the voids are located adjacent to an upper portion of the first layer near an edge of an interface between the first layer and the second layer;
    wherein a refractive index of the first layer is greater than that of the second layer;
    and
    wherein the sum of the heights of the first layer and the second layer is more than 1.7 μm.

2. The light emitting device of claim 1, wherein the diameter of each of the protrusions is about 2.5 μm to about 3.5 μm, and the pitch is about 2.5 μm or more and about 3.5 μm or less.

3. The light emitting device of claim 2, wherein the diameter of each of the protrusions is about 2.6 μm to about 2.8 μm, and the pitch is about 2.9 μm to about 3.1 μm.

4. The light emitting device of claim 3, wherein the diameter of each of the protrusions is about 2.8 μm.

5. The light emitting device of claim 1, wherein a ratio of a height of the first layer to that of the second layer in the first direction is about 0.2 to about 1.5.

6. The light emitting device of claim 5, wherein a ratio of the height the first layer to that of the second layer in the first direction is about 0.75 to about 1.5.

7. The light emitting device of claim 6, wherein the height of the second layer is greater than that of the first layer.

8. The light emitting device of claim 1, wherein the diameter of the protrusion is equal to or smaller than the pitch.

9. The light emitting device of claim 1, wherein an inclination degree of a side surface of the first layer relative to a plane perpendicular to the first direction is greater than that of at least a portion of a side surface of the second layer relative to the plane perpendicular to the first direction.

10. A light emitting device, comprising:
a substrate;
a pattern of a plurality of protrusions including a first layer formed integrally with the substrate and protruding from an upper surface of the substrate in a first direction, and a second layer provided on the first layer and formed of a material different from that of the first layer; and
voids aligned with a side of the plurality of protrusions in a second direction perpendicular to the first direction, wherein the voids are located adjacent to an upper portion of the first layer near an edge of an interface between the first layer and the second layer;
wherein a ratio of a height of the second layer to that of the first layer is greater than 2.5 and less than 9.5;
wherein a refractive index of the first layer is greater than that of the second layer; and
wherein the sum of the heights of the first layer and the second layer is more than 1.7 μm.

11. The light emitting device of claim 10, wherein a height of the first layer is about 0.25 μm or more and about 0.55 μm or less.

12. The light emitting device of claim 10, further comprising a light emitting stack on the substrate, wherein the light emitting stack is configured to emit light.

13. The light emitting device of claim 12, wherein the light emitting stack includes:
a first semiconductor layer provided on the substrate;
an active layer provided on the first semiconductor layer; and
a second semiconductor layer provided on the active layer, and
the voids are provided in the first semiconductor layer.

14. The light emitting device of claim 10, wherein an inclination degree of a side surface of the first layer relative to a plane perpendicular to the first direction is greater than that of at least a portion of a side surface of the second layer relative to the plane perpendicular to the first direction.

15. The light emitting device of claim 14, wherein an upper portion of the side surface of the second layer is rounded.

16. The light emitting device of claim 10, wherein the voids have a triangular shape when viewed on a plane perpendicular to the upper surface of the substrate.

17. The light emitting device of claim 10, wherein an upper surface of the first layer has a circular shape and the voids are located a vertexes of a regular hexagon inscribed in the circular shape of the first layer.

18. The light emitting device of claim 10, wherein the voids have a triangular shape when viewed on a plane perpendicular to the upper surface of the substrate.

19. The light emitting device of claim 10, wherein an upper surface of the first layer has a circular shape and the voids are located a vertexes of a regular hexagon inscribed in the circular shape of the first layer.

* * * * *